US 9,653,367 B2

(12) United States Patent
Maehr et al.

(10) Patent No.: US 9,653,367 B2
(45) Date of Patent: May 16, 2017

(54) METHODS INCLUDING A PROCESSING OF WAFERS AND SPIN COATING TOOL

(71) Applicant: GLOBALFOUNDRIES Inc., Grand Cayman (KY)

(72) Inventors: Torsten Maehr, Dresden (DE); Martin Freitag, Dresden (DE); Arthur Hotzel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/753,198

(22) Filed: Jun. 29, 2015

(65) Prior Publication Data

US 2016/0379900 A1  Dec. 29, 2016

(51) Int. Cl.
| | |
|---|---|
| *H01L 21/02* | (2006.01) |
| *H01L 21/67* | (2006.01) |
| *C23C 16/04* | (2006.01) |
| *H01L 21/66* | (2006.01) |
| *H01L 21/687* | (2006.01) |

(52) U.S. Cl.
CPC ............ *H01L 22/26* (2013.01); *C23C 16/042* (2013.01); *H01L 21/02282* (2013.01); *H01L 21/67051* (2013.01); *H01L 21/68714* (2013.01); *H01L 22/12* (2013.01)

(58) Field of Classification Search
CPC ............................ C23C 16/0242; H01L 22/26
USPC ............................................................ 438/7
See application file for complete search history.

(56) References Cited

U.S. PATENT DOCUMENTS

| | | | |
|---|---|---|---|
| 2001/0009135 A1* | 7/2001 | Hasebe ................... | G03F 7/162 118/52 |
| 2005/0062960 A1* | 3/2005 | Tsuji .................. | G01N 21/9503 356/237.2 |
| 2007/0058146 A1* | 3/2007 | Yamaguchi .......... | G03F 7/70775 355/53 |
| 2015/0370175 A1* | 12/2015 | Nicolaides ......... | G01N 21/9503 355/77 |

* cited by examiner

*Primary Examiner* — Moazzam Hossain
*Assistant Examiner* — Omar Mojaddedi
(74) *Attorney, Agent, or Firm* — Amerson Law Firm, PLLC

(57) ABSTRACT

A method includes performing a spin coating process. In the spin coating process, a first fluid is dispensed to a surface of a wafer. The method further includes performing an inspection of an edge area of the wafer. On the basis of the inspection of the edge area of the wafer, a defect analysis is performed. In the defect analysis, it is determined if the edge area of the wafer has a defect that is indicative of an insufficient coating of the surface of the wafer by the first fluid.

8 Claims, 10 Drawing Sheets

METHODS INCLUDING A PROCESSING OF WAFERS AND SPIN COATING TOOL

BACKGROUND OF THE INVENTION

1. Field of the Invention

Generally, the present disclosure relates to the processing of wafers and to tools for the processing of wafers, and, more particularly, to methods and tools wherein a processing of a wafer and an inspection of a wafer are performed.

2. Description of the Related Art

Integrated circuits typically include a large number of circuit elements which include, in particular, field effect transistors. The circuit elements in an integrated circuit may be electrically connected by means of electrically conductive metal lines formed in a dielectric material, for example, by means of damascene techniques. The electrically conductive metal lines may be provided in a plurality of interconnect layers that are stacked on top of each other above a substrate in and on which the circuit elements are formed. Metal lines in different interconnect layers may be electrically connected with each other by means of contact vias that are filled with metal.

For the formation of integrated circuits, techniques of photolithography may be used. In a photolithography process, a pattern in a photomask (sometimes also denoted as a "reticle") is projected to a layer of a photoresist that is provided over a wafer in an exposure tool, for example, a so-called scanner or stepper. The wafer may be a blank wafer, or it may include one or more integrated circuits in a stage of a manufacturing process. Portions of the photoresist are irradiated with actinic light, i.e., light that induces a chemical reaction in the photoresist by which the solubility of the photoresist in a subsequent development process is substantially changed, for example, ultraviolet light, which is used for projecting the pattern in the photomask to the photoresist. Other portions of the photoresist are not irradiated, wherein the pattern of irradiated portions of the photoresist depends on a pattern of photomask features provided on the photomask. This process may generally be referred to as an exposure process.

Thereafter, the exposed photoresist may be developed. Depending on whether a negative or a positive photoresist is used, and whether a negative or positive development process is used, in the development process, either the non-irradiated portions or the irradiated portions of the photoresist are dissolved in a developer and, thus, are removed from the wafer.

In some applications, several tools used for the wafer processing between the formation of the photoresist layer, which will be described in detail below, and the development of the photoresist may be integrated into larger units called integrated or lithographic or photolithographic tracks, or simply tracks, which may also include other tools like baking tools and/or exposure tools. The term "module" or "unit" is often used for a tool included in a track or a space within a track that substantially contains one tool.

After the formation of the developed photoresist layer, processes for patterning the wafer or modifying the electrical or chemical properties of the wafer may be performed using the portions of the photoresist remaining on the wafer as a photoresist mask. The processes for patterning the semiconductor structure may include one or more etch processes, wherein material is removed from portions of the wafer that are not covered by the photoresist mask. Thus, features can be formed on the wafer. The processes for modifying the electrical or chemical properties of the wafer may include one or more implantation processes, wherein ions are implanted into portions of the wafer that are not covered by the photoresist mask.

In the productive formation of integrated circuits, wafers may be processed in groups called lots, which may consist of about 1-25 wafers, for example, 12 or 25 wafers. Wafers of one lot may be processed substantially simultaneously and/or in immediate succession at each stage of the wafer production flow.

For forming a layer of a photoresist on a wafer, techniques of spin coating may be used. In spin coating, a photoresist solution that includes a photoresist and a solvent may be dispensed to a surface of a wafer that is mounted on a wafer chuck. Then, the photoresist solution may be distributed over the surface of the wafer by rotating the wafer. In some techniques of spin coating, the photoresist solution may be dispensed to the surface of the wafer while the wafer is stationary, and the rotation of the wafer may be started after the dispensing of the photoresist solution. Alternatively, the wafer may be rotated at a relatively low speed during the dispensing of the photoresist solution, and the wafer may be accelerated after the dispensing of the photoresist solution. The wafer may be rotated at a relatively high speed of rotation for an amount of time until a substantial amount of the solvent of the photoresist solution has evaporated and a solid layer of photoresist remains on the surface of the wafer.

In typical spin coating processes, only a fraction of the dispensed photoresist remains on the surface of the wafer. A substantial amount of the dispensed photoresist may be removed from the surface of the wafer during the spin coating process by centrifugal forces. Since photoresist solutions can be quite expensive, it may be of advantage to reduce the amount of photoresist solution that is dispensed to the surface of the wafer in the spin coating process. However, dispensing a too small amount of photoresist solution may lead to an insufficient wetting of the surface of the wafer by the photoresist solution. This may lead to an insufficient coating of the surface of the wafer with the photoresist layer so that the surface of the wafer has portions that are insufficiently covered by the photoresist layer. In typical spin coating processes, the minimum amount of photoresist solution required for forming a photoresist layer on a wafer is determined not by the thickness of the photoresist layer but by the amount of photoresist solution that is needed to wet the entire surface of the wafer.

A first sign of an amount of photoresist solution that is insufficient for wetting the whole surface of the wafer may be the occurrence of so-called "shark tooth" defects, which may include adhesion failures of the photoresist layer in outer regions of the wafer that extend radially outward to the edge of the wafer; in addition, such defects often (but not always) have a wedge shape. Names other than "shark tooth" are also in use in the industry for this defect type. To prevent the occurrence of such defects and other defects, and due to variations of the amount of photoresist solution that is actually dispensed on the surface of the wafer, as well as variations of the adhesion of the photoresist solution to the wafer, a safety margin is typically included into set values for the amount of photoresist solution that is dispensed to the surface of the wafer. The safety margin may be in a range from about 20-50% of the dispensed volume of the photoresist solution. Thus, providing the safety margin can substantially contribute to the amount of photoresist solution required and, accordingly, to material costs.

In the process of spin coating, other sorts of defects caused by other mechanisms may also occur, some of which may also extend to the edge of the wafer.

The applicability of spin coating is not limited to the formation of photoresist layers. Spin coating techniques may also be used for the formation of other material layers on wafer surfaces, for example, anti-reflective coatings, such as bottom anti-reflective coatings (BARCs) and top anti-reflective coatings (TARCs) which are provided below and above photoresist layers, respectively, immersion top coats, which may be formed over photoresist layers for protecting the photoresist from an immersion fluid used in immersion photolithography and vice versa, planarization and gap fill materials, spin-on hardmasks, for example hardmasks including spin-on carbon materials, some types of low-k interlayer dielectrics, and polyimides. In the application of spin coating techniques for the formation of such layers, issues similar to those described above may occur.

Furthermore, issues similar to those described above that are conventionally addressed by providing relatively large safety margins may occur in processes other than spin coating, wherein there is a critical threshold for an amount of material and/or a processing time, below which characteristic defects start to occur. Depending on the process, the characteristic defects may be different from the above-mentioned "shark tooth" defects. Examples of processes wherein there is a critical threshold for an amount of material and/or a processing time include processes of photoresist development, single wafer cleaning processes, rinse processes, pre-wetting processes, and/or wafer priming or adhesion promotion processes. In such techniques, providing relatively large safety margins for an amount of material that is used and/or for a processing time may substantially contribute to the material consumption and/or the processing time.

In the formation of integrated circuits, wafers may be inspected at different stages of the production flow, for example, after photolithography steps, to detect the presence of defects. If inspected wafers are found to have defects, the wafers and potentially other wafers that were processed in a similar way as the wafers with defects may be subjected to an additional rework process, wherein defective upper layers of the wafer may be removed and some previous processing steps may be repeated. If too many defects are found on too many wafers, one or more previous processing steps may be modified to reduce the occurrence of defects. Common inspection techniques include inspecting the whole wafer surface or a relatively large part of the wafer surface, since defects can usually occur at different locations on the wafer surface. Therefore, and because of the relatively high spatial resolution that may be required for the detection of defects, the inspection of a wafer with common inspection techniques usually takes significant time, for example, from about 1 minute to about 1 hour. As a consequence, it may be difficult to inspect all lots or all wafers of a lot at an inspection step, since this would slow down the production process too much and/or would require too many inspection tools, which are expensive. Thus, with common inspection techniques, there is a certain probability that wafers with defects escape detection, corresponding to the number of lots and/or wafers per lot which are sampled for inspection, and/or to the fraction of the wafer surface that is inspected in the inspection process.

In view of the above issues, the present disclosure provides methods and devices that may allow a reduction of amounts of materials used and/or a reduction of processing times while maintaining a relatively low likelihood of defects occurring, as well as methods and devices for efficiently inspecting wafers for defects resulting from insufficient amounts of materials and/or processing times and thus reducing the likelihood of such defects escaping detection.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes performing a spin coating process. In the spin coating process, a first fluid is dispensed to a surface of a wafer. The method further includes performing an inspection of an edge area of the wafer. On the basis of the inspection of the edge area of the wafer, a defect analysis is performed. In the defect analysis, it is determined if the edge area of the wafer has a defect that is indicative of an insufficient coating of the surface of the wafer by the first fluid.

Another illustrative method disclosed herein includes processing a plurality of wafers. The plurality of wafers includes a subset of the plurality of wafers and a rest of the plurality of wafers. Each wafer of the subset of the plurality of wafers is processed in accordance with a first value of a processing parameter. Each wafer of the rest of the plurality of wafers is processed in accordance with a second value of the processing parameter. The first value of the processing parameter is different from the second value of the processing parameter and the second value of the processing parameter is approximately equal to a set value of the processing parameter. For each of the wafers of the subset of the plurality of wafers, an inspection of the wafer and a defect analysis of the wafer are performed. In the defect analysis, it is determined if the wafer has a defect that is indicative of one of a too small value of the processing parameter and a too large value of the processing parameter.

An illustrative tool disclosed herein includes a wafer chuck, a drive, a light source, a light detector and an evaluation unit. The wafer chuck is configured for mounting a wafer thereon. The drive rotates the wafer chuck and the wafer mounted thereon around an axis of rotation. The light source emits a first light towards an edge area of the wafer while the wafer is rotated. The light detector receives a portion of the first light that is reflected by the edge area of the wafer and provides a signal in response to the received light. The evaluation unit receives the signal from the light detector and determines, on the basis of the signal, if the edge region of the wafer has a defect.

BRIEF DESCRIPTION OF THE DRAWINGS

The disclosure may be understood by reference to the following description taken in conjunction with the accompanying drawings, in which like reference numerals identify like elements, and in which.

Figure 1:
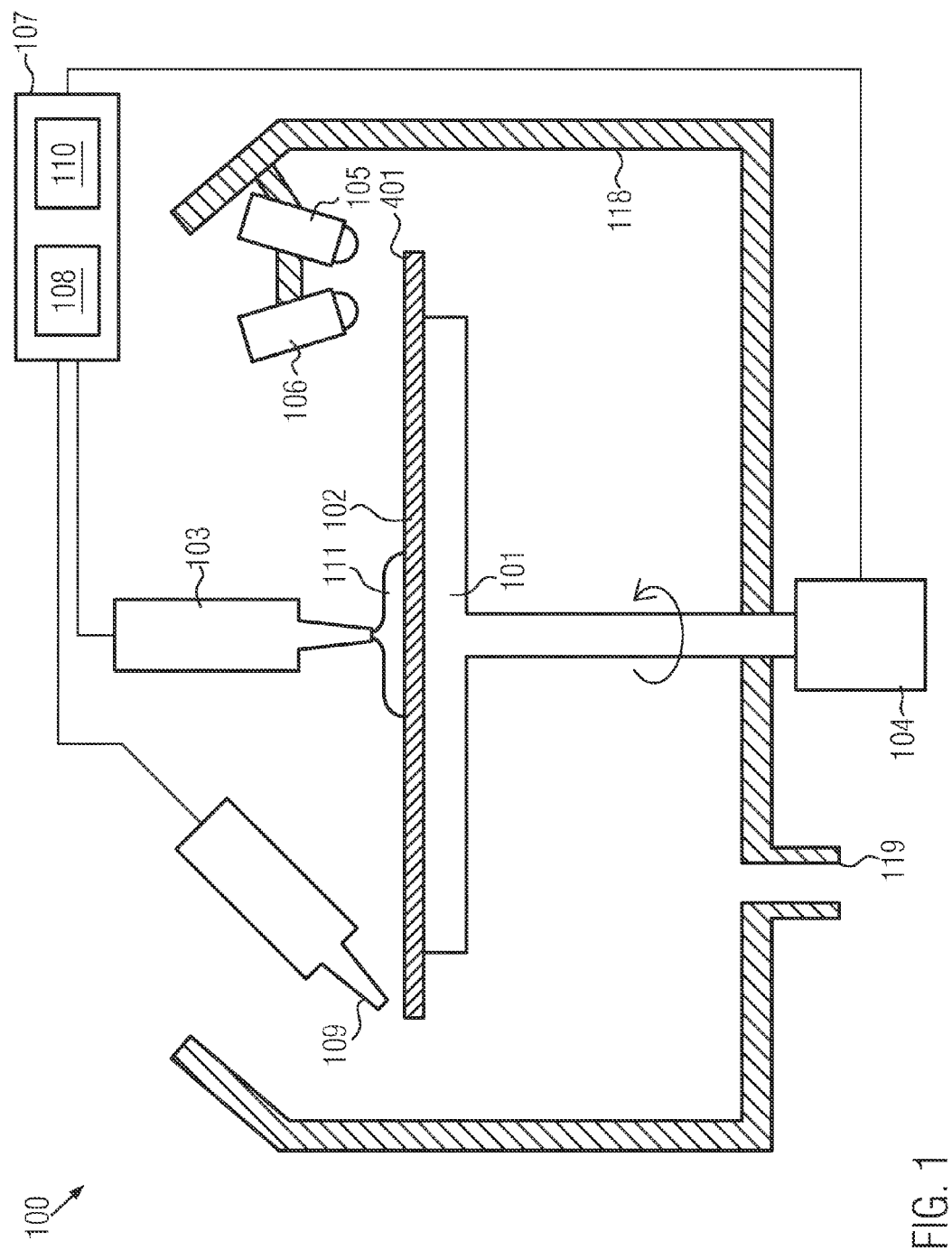
FIGS. 1, 2 and 3 show schematic cross-sectional views of a spin coating tool according to an embodiment in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments disclosed herein may allow a reduction of an amount of material that is used in a semiconductor manufacturing process and/or a reduction of a processing time. In particular, in some embodiments disclosed herein, methods and devices are provided that may help to reduce an amount of a fluid that is dispensed to a surface of a wafer in a spin coating process.

In some embodiments, an optical sensor for performing an inspection of a wafer edge may be built into a processing unit of a spin coating tool to check the edge area of coated wafers, for example, the edge area of every coated wafer, for the appearance of "shark tooth" defects caused by an insufficient amount of fluid dispensed to the surface of the wafer. A substantially complete detection of such defects, which may be obtained by inspecting every coated wafer, may allow a reduction of the dispensed amount of fluid to the minimum required for wetting the surface of the wafer, while substantially eliminating or at least reducing safety margins. The inspection of every coated wafer may also increase a sensitivity to all sorts of other coating defects and may thus help to reduce defects.

In other embodiments, an amount of dispensed fluid may be reduced compared to a nominal amount for a subset of a plurality of wafers, for example, for one or more wafers of every lot of wafers. These wafers may then be sampled for an inspection. Since the wafers that have been processed with the reduced dispensed amount of fluid have a greater likelihood of defects caused by an insufficient amount of fluid occurring, they may serve as "proximity sensors" for the minimum amount of dispensed fluid that is required for reducing a likelihood of defects occurring to a relatively low value. Such techniques may be extended to other processes that include a critical threshold for a material volume or a processing time, such as, for example, single wafer cleaning processes, photoresist development processes, wafer rinse processes, pre-wetting processes, and/or wafer priming or adhesion promotion processes, to increase the sensitivity to and the detection probability of defects related to a material volume or a processing time. In some embodiments, techniques as described herein may be used for providing a feedback loop for the adjustment of an amount of material used in a process performed at a wafer, for example, an amount of a fluid such as a coating solution used in a spin coating process, and/or for the adjustment of a processing time, to save material and/or tool time.

FIG. 1 shows a schematic cross-sectional view of a spin coating tool 100 according to an embodiment in a stage of a method according to an embodiment. The spin coating tool 100 includes a wafer chuck 101 for mounting a wafer 102 thereon. In some embodiments, the wafer chuck 101 may be a known vacuum chuck having a substantially flat wafer-receiving surface wherein small holes (not shown) connected to a vacuum source (not shown) are provided. For mounting the wafer 102 on the wafer chuck 101, the wafer 102 may be placed on the wafer chuck 101, and the vacuum source may be operated for drawing the wafer 102 towards the wafer chuck 101. For releasing the wafer 102 from the wafer chuck 101 after a spin coating process that is performed by means of the spin coating tool 100, the vacuum may be released, and the wafer 102 may be removed from the wafer chuck 101.

The wafer chuck 101 may be rotated around an axis of rotation that is substantially perpendicular to a surface of the wafer 102 mounted on the wafer chuck 101 (vertical in the plane of drawing of FIG. 1). For this purpose, the spin coating tool 100 may include a drive 104, which may include a motor connected to the wafer chuck 101.

The spin coating tool 100 further includes a dispenser 103 that is operable for dispensing a fluid 111 to a surface of the wafer 102 that is opposite the wafer chuck 101 when the wafer 102 is mounted on the wafer chuck 101. The fluid 111 may be a coating solution that includes a solvent and a material of a coating to be formed on the surface of the wafer 102, wherein the material of the coating may be dissolved in the solvent. In some embodiments, the fluid 111 may be a photoresist solution that includes a photoresist and a solvent, and may be used for coating the surface of the wafer 102 with a layer of a photoresist.

The present disclosure is not limited to embodiments wherein the fluid 111 is a photoresist solution. In other embodiments, the fluid 111 may be a coating solution for coating the surface of the wafer 102 with a material other than a photoresist, for example, with an anti-reflective coating, which may be a bottom anti-reflective coating (BARC) or a top anti-reflective coating (TARC), an immersion top coat, which may be used in an immersion photolithography process for protecting the photoresist from the immersion fluid and vice versa, a planarization material and/or a gap fill material, a spin-on hardmask, for example a spin-on carbon hardmask, or a polyimide. In further embodiments, the fluid 111 may be a coating solution that is used for coating the surface of the wafer 102 with a low-k interlayer dielectric material that may be formed by means of a spin coating process, for example, a polymeric dielectric material.

The dispenser 103 may be configured for dispensing a fluid 111 to the surface of the wafer 102. For this purpose, the dispenser 103 may be connected to a processing unit 107 that includes a control unit 110. The control unit 110 may be provided in the form of a program that is carried out by the processing unit 107, and signals from the control unit 110 may be provided to the dispenser 103 by means of an interface between the processing unit 107 and the dispenser 103. The control unit 110 may operate the dispenser 103, and it may control the amount of the fluid 111 that is dispensed to the surface of the wafer 102.

Additionally, the control unit 110 may be configured for operating the drive 104. In particular, the control unit 110 may be configured for controlling a speed of rotation of the wafer chuck 101 and the wafer 102 provided thereon.

The spin coating tool 100 may further include an edge bead removal nozzle 109 that may be connected to a fluid supply and may be adapted for directing a fluid jet 115 (see FIG. 3) towards an edge area of the wafer 102. The edge bead removal nozzle 109 may be connected to the control unit 110 provided in the processing unit 107 and the control unit 110 may operate the edge bead removal nozzle 109 for performing an edge bead removal process, which will be described in more detail below.

The spin coating tool 100 may further include a housing 118, which may have an outlet 119 for fluid supplied to the surface of the wafer 102 that does not remain on the surface of the wafer 102 and is removed from the wafer 102 by centrifugal forces during the rotation of the wafer 102.

The above-described features of the spin coating tool 100 may correspond to features of known spin coating tools.

Figure 4:
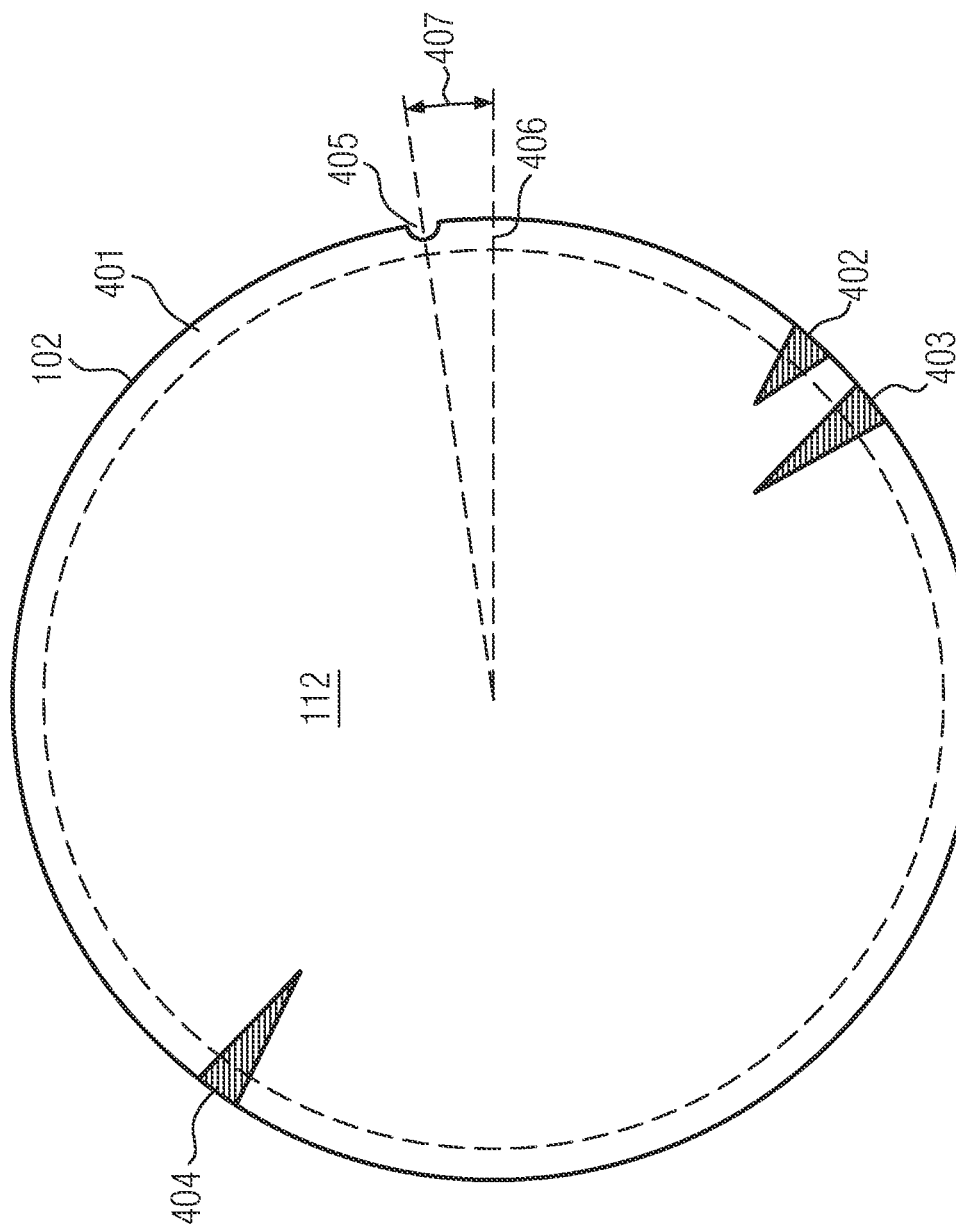
FIG. 4 schematically illustrates a wafer having defects.

In addition to the components described above, the spin coating tool 100 may include a light source 105 and a light detector 106. The light source 105 may be configured for emitting light towards an edge area 401 of the wafer 102 at the surface of the wafer 102 that is opposite the wafer chuck 101. In some embodiments, the light source 105 may be adapted to substantially emit light only towards the edge area 401 of the wafer 102, and to substantially not emit light towards a central area that is closer to the center of the wafer 102 than the edge area 401. A schematic top view of the wafer 102 showing the edge area 401 is shown in FIG. 4.

In some embodiments wherein the fluid 111 is a photoresist solution, wavelengths of the light emitted by the light source 105 may be in a range of wavelengths, wherein light having a wavelength in the range of wavelengths is not actinic, i.e., does not substantially change the solubility of the photoresist in a subsequent development process. For example, the light source 105 may emit light having wavelengths greater than about 500 nm. In other embodiments, the light source 105 may emit light having wavelengths shorter than 500 nm.

In embodiments wherein the fluid 111 does not include a photoresist, the light emitted by the light source 105 may include wavelengths greater than 500 nm and/or wavelengths shorter than 500 nm.

In some embodiments, the light source 105 may be adapted to emit substantially monochromatic light. In other embodiment, the light source 105 may emit polychromatic light that includes light having different wavelengths within a wavelength band.

The light detector 106 may be adapted to receive light that was emitted by the light source 105 and reflected by the edge area 401 of the wafer 102.

In some embodiments, the light detector 106 may be adapted to measure one or more quantities that are related to an intensity of the reflected light and to output a signal that is representative of the one or more quantities.

In some embodiments, which may include embodiments wherein the light source 105 is adapted to emit substantially monochromatic light as well as embodiments wherein the light source 105 is adapted to emit polychromatic light, the light detector 106 may be adapted for measuring an integral intensity of the light emitted by the light source 105, wherein the measurement performed by the light detector 106 is not spectrally resolved.

In embodiments wherein the light source 105 is adapted to emit polychromatic light, the light detector 106 may be adapted to perform a spectrally resolved measurement, wherein the intensity of the light reflected by the edge area 401 of the wafer 102 is measured at different wavelengths. In such embodiments, the light detector 106 may include a plurality of light sensitive detector portions that are provided with filters that are transmissive for light having different wavelengths, or the light detector 106 may include a spectrometer.

In further embodiments, the light source 105 may be adapted to emit light in a predetermined state of polarization, and the light detector 106 may be adapted for measuring intensities of light having one or more defined polarization directions reflected at the edge area 401 of the wafer 102. In such embodiments, the light detector 106 may include one or more light sensitive detector portions that are equipped with polarization filters that may be differently oriented for different detector portions. Alternatively, a polarizing beam splitter may be used for directing reflected light having one or more polarization directions to one or more detector portions.

In some embodiments, the light source 105 and/or the detector 106 may include a fixed or mobile mechanical protection against contamination by the fluid 111 and/or other substances, for example, one or more shields or caps that may be moved in front of the light emitting portion of the light source and/or the sensitive portions of the detector when the light source and the detector are not operated.

The light source 105 and the light detector 106 may be attached to the housing 118 of the spin coating tool 100, as schematically shown in FIG. 1, for substantially maintaining locations and/or orientations of the light source 105 and the light detector 106 relative to the wafer chuck 101. In other embodiments, the attachment may be flexible and allow a moving of the light source 105 and/or the detector 106, for example, for moving one or both to a different position when they are not operated, for example to protect them from contamination by the fluid 111 and/or other substances.

The light source 105 and the light detector 106 may be connected to the processing unit 107, and the control unit 110 may be configured for operating the light source 105 and the light detector 106. In particular, the control unit 110 may be adapted for switching the light source 105 on and off and/or for regulating an intensity of the light emitted by the light source 105. Additionally, the control unit 110 may be configured for operating the light detector 106 for switching the light detector 106 on and off. Additionally, in embodiments where the attachment of the light source 105 and/or the detector 106 is flexible, the control unit 110 may be configured for moving the light source and/or the detector to the positions wherein they are provided during operation, such as the positions illustrated in FIGS. 1-3, and to one or more different positions at times when the light source and/or the detector are not operated. In embodiments where the light source and/or the detector include a mobile mechanical protection, the control unit 110 may be configured for operating the mobile mechanical protections. The processing unit 107 may further be configured for receiving a signal from the light detector 106 that is representative of one or more quantities related to an intensity of the reflected light, as measured by the light detector 106.

The processing unit 107 may further include an evaluation unit 108. In some embodiments, the control unit 110 and the evaluation unit 108 may be physically separate and they may be provided at a distance from each other, while still being understood as parts of the processing unit 107. The evaluation unit 108 may be adapted for determining, on the basis of the signal received from the light detector 106, if the edge region 401 of the wafer 102 has a defect that is indicative of an insufficient coating of the surface of the wafer by the fluid 111, as will be described in more detail below.

The spin coating tool 100 may be used in a method wherein a spin coating process is performed at a plurality of wafers for forming a coating on the surface of each of the wafers, and wherein the light source 105 and the light detector 106 are used for performing a measurement on the basis of which it is determined if there are wafers the surface of which have defects of the coating. A set value for an amount of fluid used in the spin coating process may then be adjusted on the basis of a result of the determining.

In the following, such methods will be described, wherein reference will be made to FIG. 8 that shows a schematic flow diagram 800 of a method according to an embodiment. At 801, a set value for an amount of the fluid 111 that is dispensed to a surface of a wafer by the dispenser 103 may be provided. In some embodiments, the set value may be a set value for a volume of the fluid 111. The set value for the amount of the fluid 111 may be provided in accordance with known techniques for determining an amount of a coating solution that is dispensed to a surface of a wafer in a spin coating process, which may include theoretical calculations and/or experiments. The set value for the amount of the fluid 111 may include a safety margin for the dispensed volume of the fluid 111, for example, a safety margin of about 20-50% of the dispensed volume, in accordance with safety margins used in conventional spin coating processes, as described above. In other embodiments, the safety margin included in the set value may be smaller than about 20%. In later stages of the method, the set value for the amount of the fluid 111 may be reduced, so that a smaller safety margin is provided, as will be detailed below.

At 802, a plurality of wafers may be provided. The plurality of wafers may include one or more lots of wafers for which a spin coating process is to be performed within a particular context of a semiconductor manufacturing process. The wafers of the plurality of wafers may fulfill one or more predetermined conditions that relate to the context of the manufacturing process wherein the spin coating process is to be performed.

In particular, the plurality of wafers may include a plurality of wafers wherein the spin coating process is to be performed by means of one of one or more predetermined tools, such as the spin coating tool 100 described above with reference to FIG. 1. Additionally and/or alternatively, the plurality of wafers may include wafers wherein the spin coating process is to be performed at one of one or more predetermined stages of a wafer production flow. For example, the spin coating process may be performed for forming a photoresist layer which is to be exposed using one of one or more particular photomasks. Additionally and/or alternatively, the plurality of wafers may include wafers wherein the spin coating process is performed during a formation of one of one or more predetermined layers of an integrated circuit. The layers of the integrated circuit may include an active layer, wherein active regions are defined in the semiconductor material of the wafer by forming trench isolation structures and/or performing ion implantation processes, a poly layer, wherein gate electrodes are formed, a contact layer, wherein electrical contacts to field effect transistors formed at the wafer are provided, or one of a plurality of metal and via layers wherein electrical connections of the interconnect levels are provided.

The plurality of wafers provided at 802 may include one lot of wafers, or a plurality of lots of wafers. The plurality of wafers 802 need not be provided at one point in time. Alternatively, the plurality of wafers may be provided sequentially at different points in time. At 803, one of the plurality of wafers may be processed by the spin coating tool 100 or by one of one or more spin coating tools similar to tool 100. At 804, the wafer may be inspected, and a defect analysis may be performed wherein it is determined if the wafer has a defect. For this purpose, the spin coating tool 100 or a similar tool may also be used. In some embodiments, the defect analysis may include a determining of a number and/or size and/or total area and/or a location of defects on the wafer. In other embodiments, in the defect analysis, the mere presence or absence of a defect may be determined. In some embodiments, all of the wafers of the plurality of wafers that undergo the processing at 803 will also undergo the inspection and defect analysis at 804. In other embodiments, the inspection and defect analysis at 804 may be performed only for a part of the plurality of wafers.

In some embodiments, the inspection and defect analysis of the wafer at 804 may be preliminarily performed only for a part of the plurality of wafers, and, depending on results of the defect analysis of the wafers of the part of the plurality, the inspection and defect analysis may be performed for further wafers of the plurality of wafers. For example, if it is determined that one wafer of a lot has a defect, all of the wafers of the lot may be inspected, and a defect analysis may be performed for all wafers of the lot.

At 805, it is determined if all the wafers of the plurality of wafers were processed. If not, a next one of the plurality of wafers is processed, and an inspection and defect analysis of the wafer may be performed. If all wafers of the plurality of wafers have been processed, the method continues at 806, as will be described below.

In the following, a processing of the wafers, an inspection of the wafers and a defect analysis of the wafers performed at 803 and 804 according to embodiments will be described with reference to FIGS. 1-5, wherein the processing, inspection and defect analysis of the wafer 102, which represents an exemplary one of the plurality of wafers received at 802, will be described. For other wafers of the plurality of wafers, corresponding techniques may be applied.

Referring to FIG. 1, the wafer 102 may be provided on the wafer chuck 101. Then, the dispenser 103 may be operated for dispensing an amount of the fluid 111 that is approximately equal to the set value for the amount of the fluid 111 to the surface of the wafer 102. For this purpose, the dispenser 103 may be operated by the control unit 110 provided in the processing unit 107. In some embodiments, the wafer chuck 101 and the wafer 102 mounted thereon may be rotated while the fluid 111 is dispensed to the surface of the wafer 102. For this purpose, the control unit 110 may operate the drive 104 for rotating the wafer chuck 101, wherein a relatively small speed of rotation may be provided. In other embodiments, the wafer chuck 101 and the wafer 102 may be substantially static while the fluid 111 is dispensed to the surface of the wafer 102.

Figure 2:
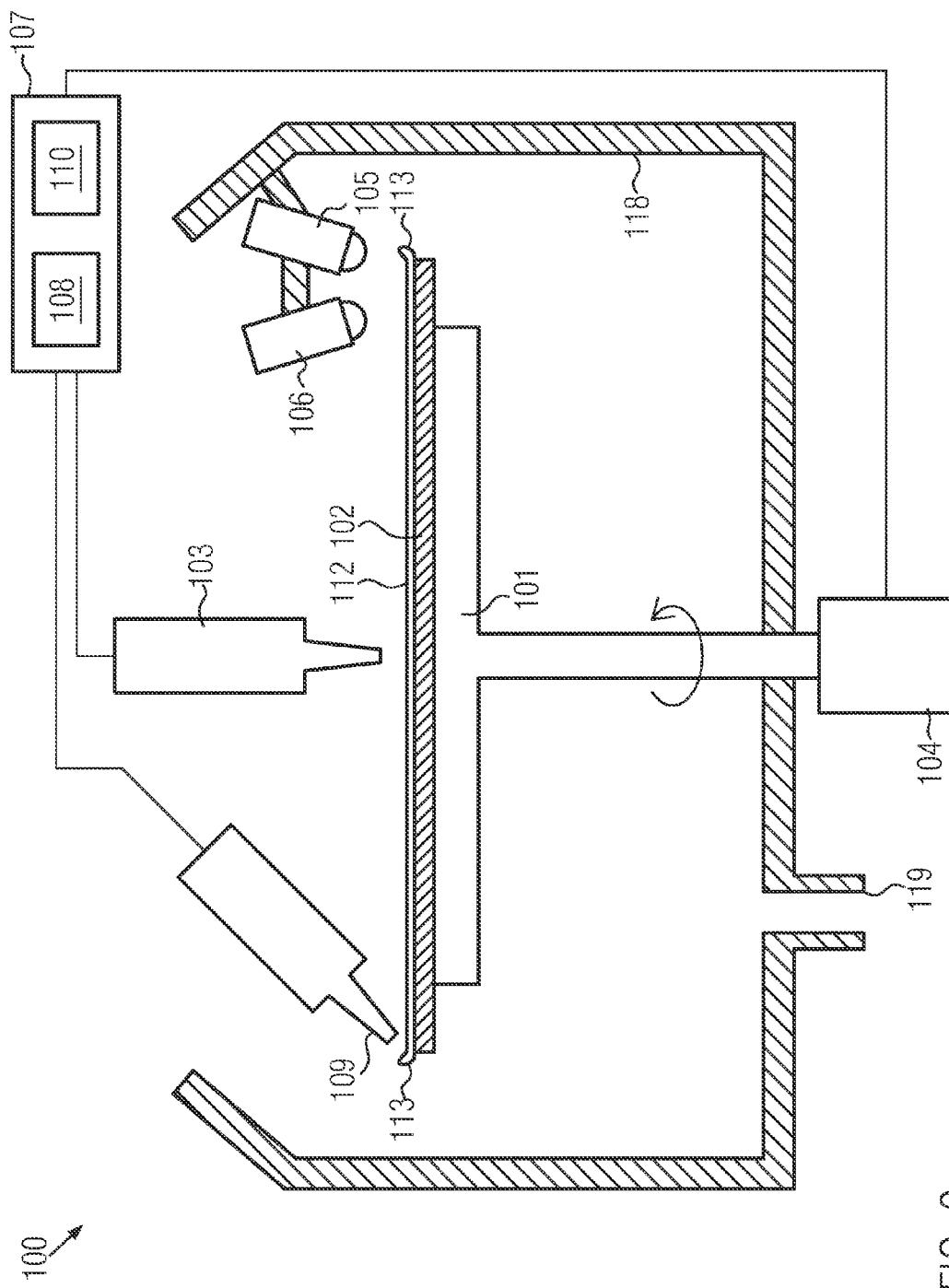

FIG. 2 shows a schematic cross-sectional view of the spin coating tool 100 in a later stage of the processing of the wafer 102. After the dispensing of the fluid 111, the drive 104 may be controlled by the control unit 110 for accelerating the wafer chuck 101 and the wafer 102 mounted thereon to a relatively high final speed of rotation and for maintaining the final speed of rotation for a predetermined amount of time. The final speed of rotation and/or the speed of rotation that is provided while the fluid 111 is dispensed to the surface of the wafer 102 may be selected in accordance with known spin coating techniques. Due to centrifugal forces caused by the rotation of the wafer 102, the fluid 111 that was dispensed to the surface of the wafer 102 may be distributed over the surface of the wafer 102 so that the surface of the wafer 102 is wetted by the fluid 111. A part of the fluid 111 may flow off the surface of the wafer 102, may be caught by the housing 118 of the spin coating tool 100 and may flow through the outlet 119.

A solvent, which may be provided in the fluid 111 as described above, may evaporate during the rotation of the wafer 102, and a coating material, for example, a photoresist or another coating material which may be provided in the fluid 111 in addition to the solvent, as described above, may remain on the surface of the wafer 102. Thus, the surface of the wafer 102 may be coated with the coating layer 112. At the edge of the wafer 102, an edge bead having a greater thickness than other portions of the coating layer 112 may be formed in the spin coating process, as schematically denoted by reference numeral 113.

If the amount of the fluid 111 that was dispensed to the surface of the wafer 102 is relatively low, the coating layer 112 may have defects wherein there are portions of the surface of the wafer 102 that are not covered by the coating layer 112 and/or that are incompletely covered by the coating layer 112 and/or wherein there is an insufficient adhesion between the surface of the wafer 102 and the coating layer 112.

FIG. 4 shows a schematic top view of the wafer 102, wherein exemplary defects of the coating layer 112 are shown and denoted by reference numerals 402, 403, 404. The defects 402, 403, 404 may have shapes and locations on the surface of the wafer 102 which are characteristic for an insufficient amount of the fluid 111. In particular, the defects 402, 403, 404 may be so-called "shark tooth" defects often having a wedge shape, which typically occur in outer regions of the wafer 102, at a distance to the center of the wafer 102 and extend to the edge area 401 of the wafer 102, as schematically shown in FIG. 4. Since defects caused by an insufficient amount of the fluid 111 typically extend to the edge area 401 of the wafer 102, inspecting the edge area 401 may be sufficient for detecting the presence of the defects 402, 403, 404. Therefore, in some embodiments, an inspection of portions of the surface of the wafer 102 other than the edge area 401 may be omitted.

The number of defects 402, 403, 404, and the locations of the defects 402, 403, 404 along the azimuthal direction of the wafer 102 shown in FIG. 4 are of an exemplary nature only, and a different number of defects as well as different locations, sizes and shapes of defects may be obtained. However, an extension of the defects to the edge area 401 of the wafer 402 may be characteristic for an insufficient amount of the fluid 111 that is dispensed to the surface of the wafer 102 by the dispenser 103.

Figure 3:
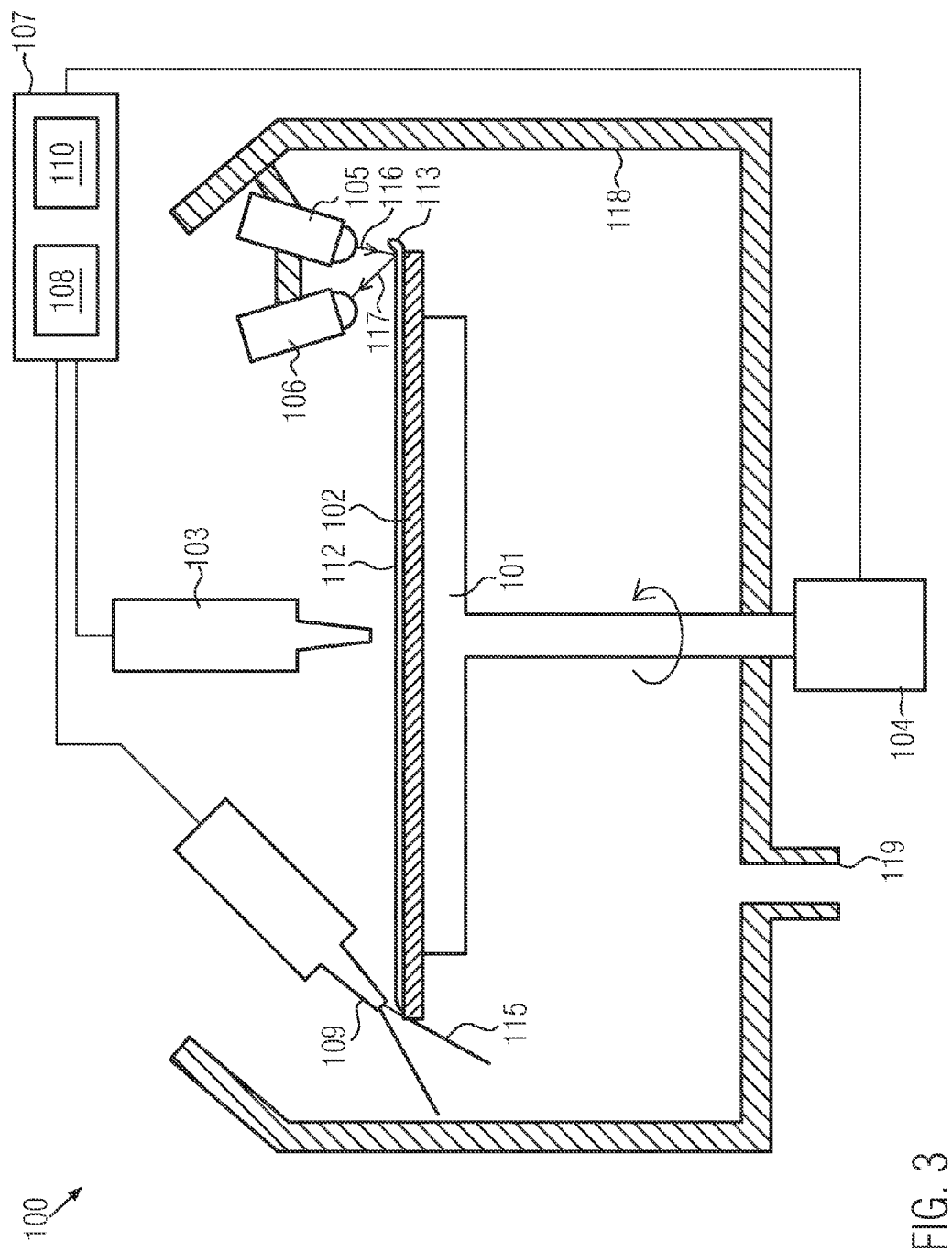

FIG. 3 shows a schematic cross-sectional view of the spin coating tool 100 in a later stage of the spin coating process. After the formation of the coating layer 112, an edge bead removal process may be performed for removing the edge bead 113 from the wafer 102. This may be done by directing a fluid jet 115 towards the edge area 401 of the wafer 102. This may be done by operating the edge bead removal nozzle 109 and/or a fluid supply connected thereto. The operation of the edge bead removal nozzle 109 and/or the fluid supply connected thereto may be controlled by the control unit 110. The fluid jet 115 may include a fluid that is different from the fluid 111 that is supplied to the surface of the wafer 102 by the dispenser 103. In some embodiments, the fluid of the fluid jet 115 may include a solvent that is adapted for dissolving a material of the coating 112 formed on the surface of the wafer 102, wherein, however, the fluid of the fluid jet 115, as output by the edge bead removal nozzle 109, does not include a coating material dissolved in the solvent. However, the fluid jet 115 may dissolve material of the coating layer 112 at the edge area 401 of the wafer 102, which may include the edge bead 113.

During the edge bead removal process, the control unit 110 may operate the drive 104 so that the wafer chuck 101 and the wafer 102 mounted thereon are rotated, wherein a speed of rotation may be smaller than the relatively high speed of rotation that is provided for forming the coating 112. Further features of the edge bead removal process may correspond to those of known edge bead removal processes.

In some embodiments, the inspection of the wafer 102 that is performed at 804 in the method illustrated by the flow diagram 800 may be performed while the edge bead removal nozzle 109 directs the fluid jet 115 towards the edge area 401 of the wafer 102. In some embodiments, the inspection of the wafer 102 may be performed during substantially the whole time of the edge bead removal process. In other embodiments, the inspection of the wafer may be performed during a part of the time the edge bead removal nozzle 109 directs the fluid jet 115 to the edge area 401 of the wafer 102. In some embodiments, the inspection of the wafer 102 may be performed during one rotation of the wafer 102.

For inspecting the wafer 102, the light source 105 may be operated for emitting light 116 towards the edge area 401 of the wafer 102, and the light detector 106 may be operated for receiving reflected light 117, being light 116 emitted by the light source 105 and reflected at the edge area 401 of the wafer 102. For this purpose, the control unit 110 may control the light source 105 and the light detector 106 for emitting light and for receiving light, respectively, while the edge bead removal process is performed.

In other embodiments, the control unit 110 may control the light source 105, the light detector 106, and the drive 104 to emit light 116, receive light 117, and simultaneously rotate the wafer chuck 101 with the wafer 102, respectively, independently of an edge bead removal process, for example before or after an edge bead removal process. In still further embodiments, the coating tool 100 may include no edge bead removal nozzle 109 and/or no edge bead removal process may be performed at the wafer as part of the wafer processing, and the inspection by light source 105 and light detector 106 may be performed as described above, but without connection to an edge bead removal process.

The inspection of the wafer 102 may include a measurement of a reflection trace of the edge area 401 of the wafer 102. The reflection trace may include a plurality of values of each of one or more quantities that are related to an intensity of the reflected light at a plurality of measurement positions in the edge area 401 of the wafer 102. In some embodiments, the reflection trace may include measurement values of the one or more quantities related to the intensity of the reflected light in dependency of an azimuthal angle relative to the wafer 102. In FIG. 4, the azimuthal angle of an exemplary measurement position 406 is denoted by reference numeral 407. The azimuthal angle 407 of the measurement position 406 may be measured relative to an indicator of a predetermined position at the edge of the wafer 102, for example, relative to a notch 405. Indicators of predetermined positions on the wafer 102 other than notches, such as, for example, flats, may also be used.

In embodiments wherein the detector 106 is adapted to measure an integral intensity of the reflected light, the reflection trace may include a plurality of measurements of the integral intensity of the reflected light 117 in dependence of the azimuthal angle.

In embodiments wherein the light source 105 is a polychromatic light source and the light detector 106 is adapted to perform spectrally resolved measurements, the reflection trace may include measurements of intensities of the reflected light 117 at a plurality of wavelengths in dependence of the azimuthal angle.

In embodiments wherein the light detector 106 is adapted for performing polarization dependent measurements, the reflection trace may include a plurality of measurements of intensities of the reflected light 117 for one or more polarization directions in dependence of the azimuthal angle.

Figure 5:
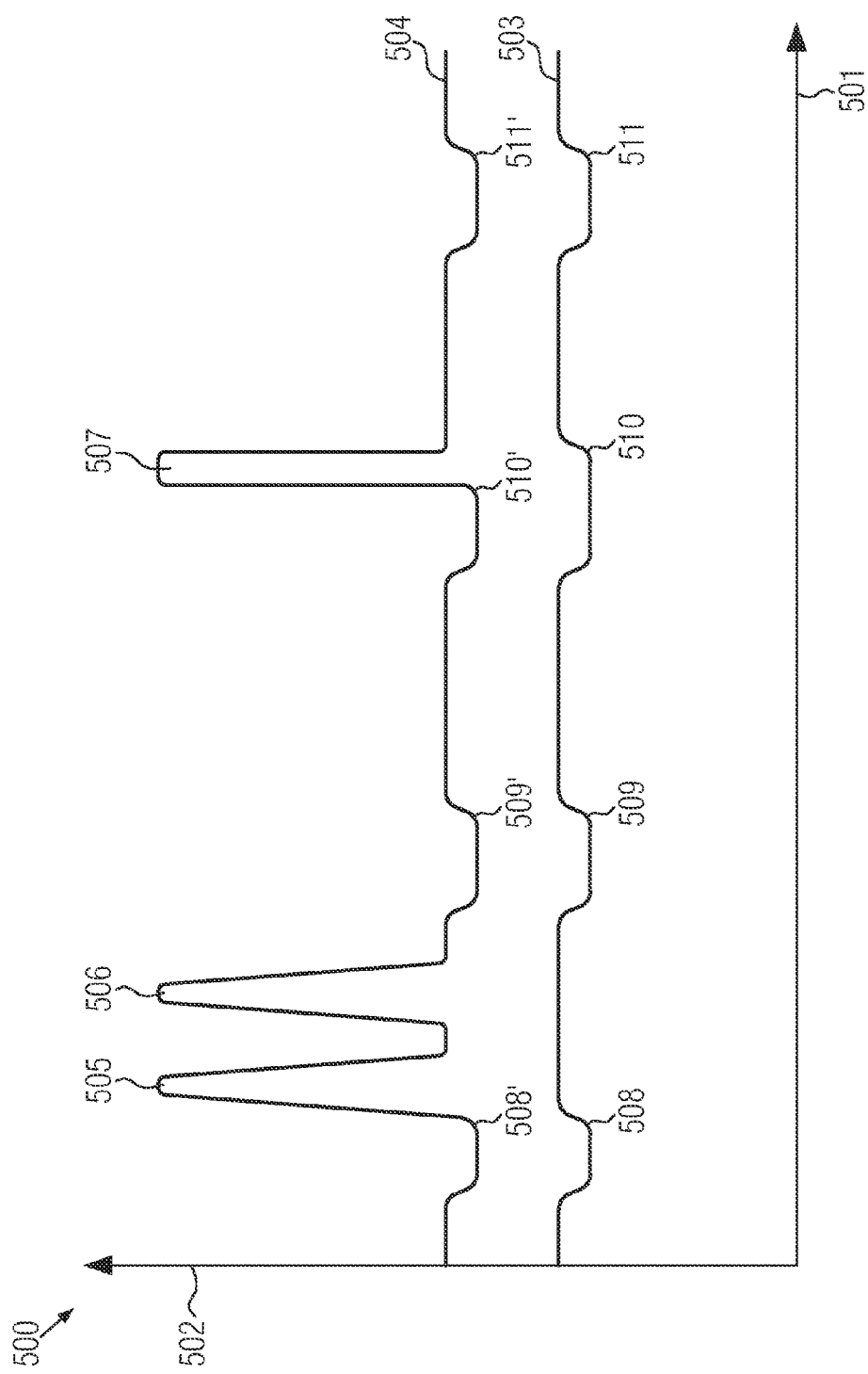
FIG. 5 schematically illustrates reflection traces of an intact wafer and a wafer having defects.

FIG. 5 shows a diagram 500 comprising curves 503, 504 that illustrate reflection traces. A horizontal coordinate axis 501 denotes the azimuthal angle, and a vertical coordinate axis 502 denotes an intensity of the reflected light 117. Curve 503 schematically illustrates a reflection trace for a wafer that does not have defects 402, 403, 404, and curve 504 schematically illustrates a reflection trace obtained for the wafer 102 that has defects 402, 403, 404.

For convenience, in FIG. 5, the curve 504 has been shifted relative to the curve 503 in the vertical direction; in some embodiments, at portions of the edge area 401 of the wafer 102 outside the defects 402, 403, 404, the intensities of the reflected light 117 measured at the wafer 102 may be approximately equal to intensities measured at a wafer without defects, apart from measurement inaccuracies, fluctuations of the emitted light 116 and/or fluctuations of reflection properties of the coating layer 112 and the underlying wafer levels.

The reflection trace of a wafer without defects 402, 403, 404, as illustrated by curve 503, may have azimuthal variations 508, 509, 510, 511, which may be caused by measurement inaccuracies, fluctuations of the emitted light 116 and/or different reflection properties of materials in underlying wafer levels in the edge area 401 of the wafer 102. Similar azimuthal variations 508', 509', 510', 511' may also be present in curve 504 that represents the reflection trace of the wafer 102 having defects 402, 403, 404. Azimuthal variations similar to variations 508-511 and 508'-511' may occur systematically, i.e., at substantially the same azimuthal angle for one or more wafers of the plurality of wafers, as indicated in FIG. 5 by the variations occurring at similar azimuthal angles in curve 503 and curve 504, and/or they may occur randomly, i.e., at varying azimuthal angles and in varying numbers for one or more wafers of the plurality of wafers.

Additionally, the reflection trace of the edge area 401 of the wafer 102 may include irregularities 505, 506, 507 that correspond to the defects 402, 403, 404. In some embodiments, the irregularities 505, 506, 507 may include higher values of the intensity of the reflected light 117 that are measured at azimuthal angles corresponding to the locations of the defects 402, 403, 404, as exemplarily shown in FIG. 5. The irregularity 505 may correspond to the defect 402, the irregularity 506 may correspond to the defect 403 and the irregularity 507 may correspond to the defect 404. In other embodiments, the irregularities 505, 506, 507 may include lower values of the intensity of the reflected light.

In embodiments wherein different quantities related to an intensity of the reflected light 117 are measured, a plurality of curves similar to curve 503 or curve 504, respectively, may be obtained for each wafer.

The measured reflection trace of the edge area 401 of the wafer 102 may be used for a defect analysis wherein it is determined if the wafer 102 has defects 402, 403, 404.

In some embodiments, this may be done by detecting the irregularities 505, 506, 507 of the reflection trace. For this purpose, the irregularities 505, 506, 507 may be separated from azimuthal variations 508', 509', 510', 511' that are caused by azimuthal variations of the reflection properties of the underlying wafer levels. In some embodiments, this may be done on the basis of a criterion related to an intensity of the reflected light 117. For example, portions of the reflection trace corresponding to azimuthal angles at which particularly high and/or particularly low values of the intensity of the reflected light 117 were measured may be identified as irregularities caused by defects 402, 403, 404. In some embodiments, this may be done by comparing the measured intensities of the reflected light 117 with one or more threshold values. As can be seen in FIG. 5, not only the presence of defects in the coating layer 112 may be determined from the reflection trace, but also their number and location may be determined from the number and position over the horizontal axis of the irregularities. Similarly, the size of a defect may be determined by the width of the corresponding irregularity over the horizontal axis.

In embodiments wherein a plurality of quantities related to an intensity of the reflected light are measured, the irregularities 505, 506, 507 may be identified by comparing each of the measured quantities with one or more threshold values. Additionally and/or alternatively, functions of the measured quantities, for example, ratios between the measured quantities, may be compared with one or more threshold values. Ratios between measured quantities may include ratios between intensities of the reflected light 117 measured at different wavelengths and/or different polarization directions.

In other embodiments, the irregularities 505, 506, 507 may be identified by comparing the measured reflection trace with a reference reflection trace. The reference reflection trace may provide an approximation of a reflection trace of a wafer without defects, such as the reflection trace illustrated by curve 503 in FIG. 5. It may be determined that the reflection trace has an irregularity that indicates the presence of a defect if there are portions of the reflection trace wherein a difference between a measured quantity relating to an intensity of the reflected light 117 and a corresponding quantity of the reference reflection trace, such as, for example, a value of the reference reflection trace corresponding to the same azimuthal angle and/or the same wavelength and/or the same polarization direction, is greater or smaller than a threshold value.

In some embodiments, the reference reflection trace may be a fault detection and classification trace (FDC trace) that is created on the basis of historical reflection traces that were obtained by an inspection of wafers using techniques as described above. The historical reflection traces may be traces which were obtained for wafers used in the formation of a same or similar type of integrated circuit at a same or similar stage of the wafer production flow and/or during a formation of a same or similar layer of the integrated circuit and/or for wafers processed on the same spin coating tool 100 or one or more spin coating tools similar to spin coating tool 100. In some embodiments, the FDC trace may be obtained by averaging the historical reflection traces or calculating a median trace of historical reflection traces.

In other embodiments, the reference reflection trace may be obtained by performing a simulation of the reflection of light at a wafer that does not have a defect, wherein the simulation may be performed on the basis of a layout of integrated circuits to be formed on the wafer, and/or on the basis of a model for the reflection of light at the coating 112 and/or features of the integrated circuit that are present at a stage of the wafer production flow at which the inspection is performed.

In further embodiments, the defect analysis for wafer 102 may be performed on the basis of a comparison of the reflection trace measured for the wafer 102 with reflection traces that were measured in the inspection of other wafers of the plurality of wafers received at 802, in particular with an ensemble of reflection traces obtained for wafers of the same lot.

Figure 8:
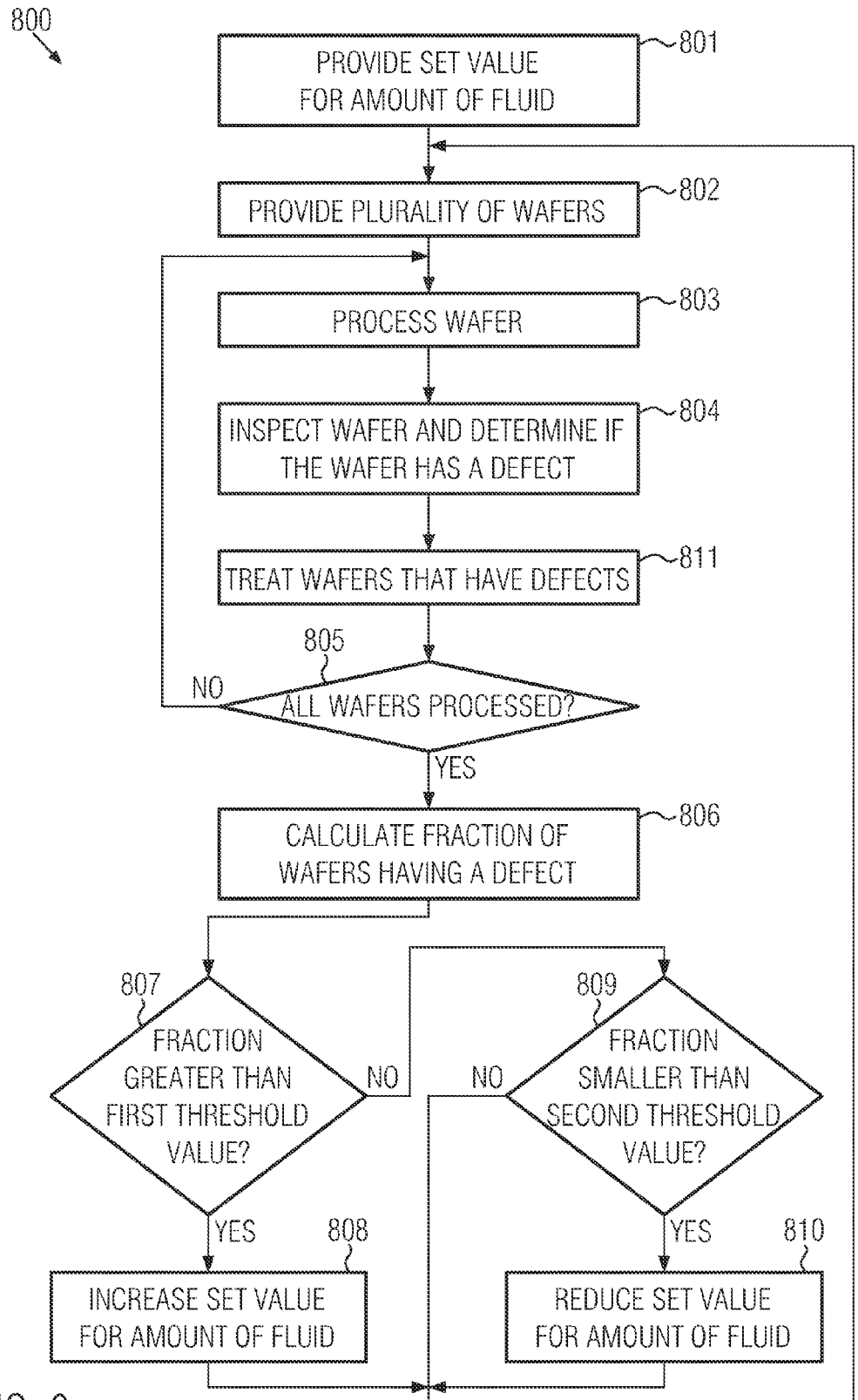
FIG. 8 shows a schematic flow diagram of a method according to an embodiment.

In such embodiments, the defect analysis for each of the wafers may be performed after the processing and inspection of a group of wafers of the plurality of wafers containing the wafer, in particular all wafers of the same lot, wherein the inspection of the wafers and the defect analysis for each of the wafers may be performed in an order that is different from that shown in the illustrative flow diagram of FIG. 8. In some embodiments, an average or median reflection trace of the wafers of the group may be determined, and a defect may be identified by a portion of the reflection trace measured for the wafer wherein a difference between a quantity relating to an intensity of the reflected light 117 measured at the wafer and a corresponding quantity of the average or median reflection trace, such as, for example, a value of the average or median reflection trace corresponding to the same azimuthal angle and/or the same wavelength and/or the same polarization direction, is greater or smaller than a threshold value.

In some embodiments, the defect analysis may include a further examination of the wafer 102 when it is determined that the wafer 102 has a defect. Thus, it may be confirmed if the result of the defect analysis, for example a defect analysis that is obtained as described above, is correct; if not, the defect analysis may be adjusted on the basis of the further examination. The further examination may be performed in accordance with known automatic or manual techniques for the inspection of wafers. The further examination may be performed, for example, in embodiments wherein there are difficulties associated with distinguishing variations not indicative of defects such as variations 508-511 and 508'-511' in FIG. 5 with sufficient certainty from irregularities indicative of defects such as irregularities 505, 506, 507 in FIG. 5. Wafers wherein it is found in the further examination that the wafer does not have a defect may be discounted as wafers having defects in the further course of the process flow.

Furthermore, the further examination may be included in embodiments wherein a significant portion of defects found in 804 is not related to the set value provided in 801, and the further examination may serve to distinguish defects not related to the set value from defects related to the set value. In some embodiments, only the latter defects may be considered in the further course of process flow 800. Defects identified as being not related to the set value in the further examination may be discounted as defects in the further course of the process flow 800, and wafers having no defects identified as being related to the set value in the further examination may be discounted as wafers having defects in the further course of the process flow, although such wafers may still undergo further treatment, for example reworking.

Similarly, in some embodiments, the defect analysis may include performing a discrimination between defects not related to the set value and defects related to the set value by further analysis of the recorded reflection signals, for example, by comparing the number, azimuthal positions, azimuthal widths and/or amplitudes of irregularities corresponding to 505, 506 and 507 in FIG. 5 to typical corresponding values for wafers having defects not related to the set value and/or wafers having defects related to the set value.

In alternative embodiments, the further examination to verify the existence of defects and/or classification of defects may be omitted.

Further referring to FIG. 8, at 811, the wafers for which it has been determined that the wafers have defects may be treated. The treatment of a wafer identified as having defects need not be performed before the next wafer of the plurality is processed, inspected and analyzed, but wafers identified as having defects may also be grouped for the treatment, e.g., all wafers of a lot that are identified as having defects may be treated after processing, inspection and defect analysis has been completed for the wafers of the lot. The treatment of the wafers that have defects may include a reworking of the wafers. In the reworking of the wafers, the coating 112 formed on the surfaces of the wafers in the spin coating process may be removed. In embodiments wherein the coating 112 includes a photoresist, this may be done by means of a known photoresist strip process. Thereafter, a further spin coating process may be performed for forming a substantially intact coating layer.

In some embodiments, the treatment of wafers may include a treatment of further wafers for which it is determined, based on results of the inspection and defect analysis of wafers other than the further wafers, that they have an increased risk of having one or more defects. For example, in embodiments where only a part of the plurality of wafers provided at 802 undergoes inspection and defect analysis at 804, all wafers of a lot, including the wafers that have not been inspected, may be reworked after processing if defects are found on a number of wafers of the lot that is higher than a predetermined threshold number.

In some embodiments, the reworking of the wafers that have defects may be performed without performing further processing steps, such as photoresist exposure steps, baking steps and/or photoresist developing steps. Depending on production strategy and recipe setup, this may help to increase scanner and/or track throughput. In other embodiments, the reworking of the wafers that have defects may be performed after one or more further processing steps, and the reworking may include repeating these processing steps after the further spin coating process.

Further referring to FIG. 8, at 806, one or more indicative quantities that are indicative of an occurrence of defects in the plurality of wafers may be calculated. In some embodiments, the one or more indicative quantities may include one or more quantities indicative of a fraction of wafers having a defect. Additionally and/or alternatively, the one or more indicative quantities may include one or more quantities indicative of the average number and/or size and/or total area of defects per wafer. For convenience, only the case of quantities indicative of a fraction of wafers with defects is illustrated in FIG. 8.

The one or more indicative quantities may be calculated by comparing a number of wafers from the plurality of wafers provided at 802 for which it was determined that the wafer has a defect or a number and/or size and/or total area of defects identified on the wafers from the plurality of wafers provided at 802 with a number of wafers from the plurality of wafers which were inspected. In particular, a ratio between the number of wafers for which it has been determined that the wafer has a defect and the number of wafers from the plurality of wafers which have been inspected may be calculated. Additionally and/or alternatively, a number of wafers that has been processed and/or inspected since the last wafer for which a defect was detected may be determined.

At 807, it may be determined if at least one of the indicative quantities is greater than a first threshold value. If this is the case, the method proceeds at 808. Otherwise, the method proceeds at 809. In some embodiments wherein the one or more indicative quantities include one or more quantities indicative of a fraction of wafers having a defect, at 807, it may be determined if the ratio between the number of wafers for which it has been determined that the wafer has a defect and the number of wafers which have been inspected is greater than the first threshold value. In such embodiments, the first threshold value may be in a range from about 0% to about 1%, for example, the first threshold value may be about 0.3%. In other embodiments, it may be determined if an indicative quantity that is indicative of an average number and/or size and/or total area of defects per wafer is greater than a suitably selected first threshold value.

At 808, the set value for the amount of the fluid 111 that is dispensed to the surface of the wafers may be increased, for example, by a percentage in a range from about 1% to about 5%, in particular by about 2%. Then, the method is continued at 811.

If the at least one indicative quantity is smaller than the first threshold value, at 809, it is determined if at least one of the indicative quantities is smaller than a second threshold value. The indicative quantity used at 809 may be different from the quantity used at 807 and/or the second threshold value may be different from the first threshold value. If the at least one indicative quantity is smaller than the second threshold value, the method is continued at 810. Otherwise, the method is continued at 811. In some embodiments wherein the one or more indicative quantities include one or more quantities indicative of a fraction of wafers having a defect, at 809, it may be determined that the at least one quantity indicative of the fraction of wafers having a defect is smaller than the second threshold value if no defect has been detected after an inspection of a number of wafers greater than a number of wafers in a range from about 100 to about 5000, for example, after an inspection of about 1000 wafers or more. In other embodiments, it may be determined if an indicative quantity that is indicative of an average number and/or size and/or total area of defects per wafer is smaller than a suitably selected second threshold value.

At 810, the set value for the amount of the fluid 111 that is dispensed to the surface of the wafers may be reduced by a predetermined percentage, for example, a percentage in a range from about 0.5% to about 3%, for example, by about 1%.

The increasing of the set value for the amount of fluid performed at 808, and the reduction of the set value for the amount of fluid performed at 810 may be performed in a context-based manner, wherein the increased and/or reduced set value for the amount of fluid is used only for the processing of wafers in the same context as the processing of the plurality of wafers provided at 802.

The method illustrated by the flow diagram 800 of FIG. 8 may then continue with an iteration starting at 802, wherein another plurality of wafers that are to be processed in the same context of the manufacturing process is provided. In the course of a plurality of iterations, the set value of the amount of fluid may be adjusted to be approximately equal to a minimum value required for maintaining a relatively low rate of defects.

In FIGS. 1-3, and in the description of embodiments with reference to these figures, tools for recording reflection traces 503 and 504, such as light source 105 and light detector 106, are described as being integrated into a housing 118 of a spin coating tool 100. In further embodiments, components provided for recording reflection traces 503 and 504 including a processing unit, a control unit, an evaluation unit, a drive, a chuck, a light source and a light detector, corresponding to the components denoted by reference numerals 107, 110, 108, 104, 101, 105 and 106, respectively, in FIGS. 1-3 may be integrated into one or more separate tools or units or one or more other processing tools or units, for example, bake or development tools, or wafer edge exposure tools, which may be included in an integrated lithographic track ensemble containing also one or more spin coating tools, for methods substantially similar to the methods described with reference to FIGS. 3-5 and FIG. 8, wherein the inspection at 804 is performed in the one or more separate processing tools or units or the one or more other processing tools or units. Furthermore, between the coating of the wafer and the inspection at 804, further processing steps other than an edge bead removal may be performed at the wafer in other tools or units, for example, baking steps. In some embodiments, in particular if the inspection is performed in a separate tool that is not part of an integrated lithographic track, these further processing steps may also include exposure of the coated wafer using a photomask and/or a development process.

Figure 6:
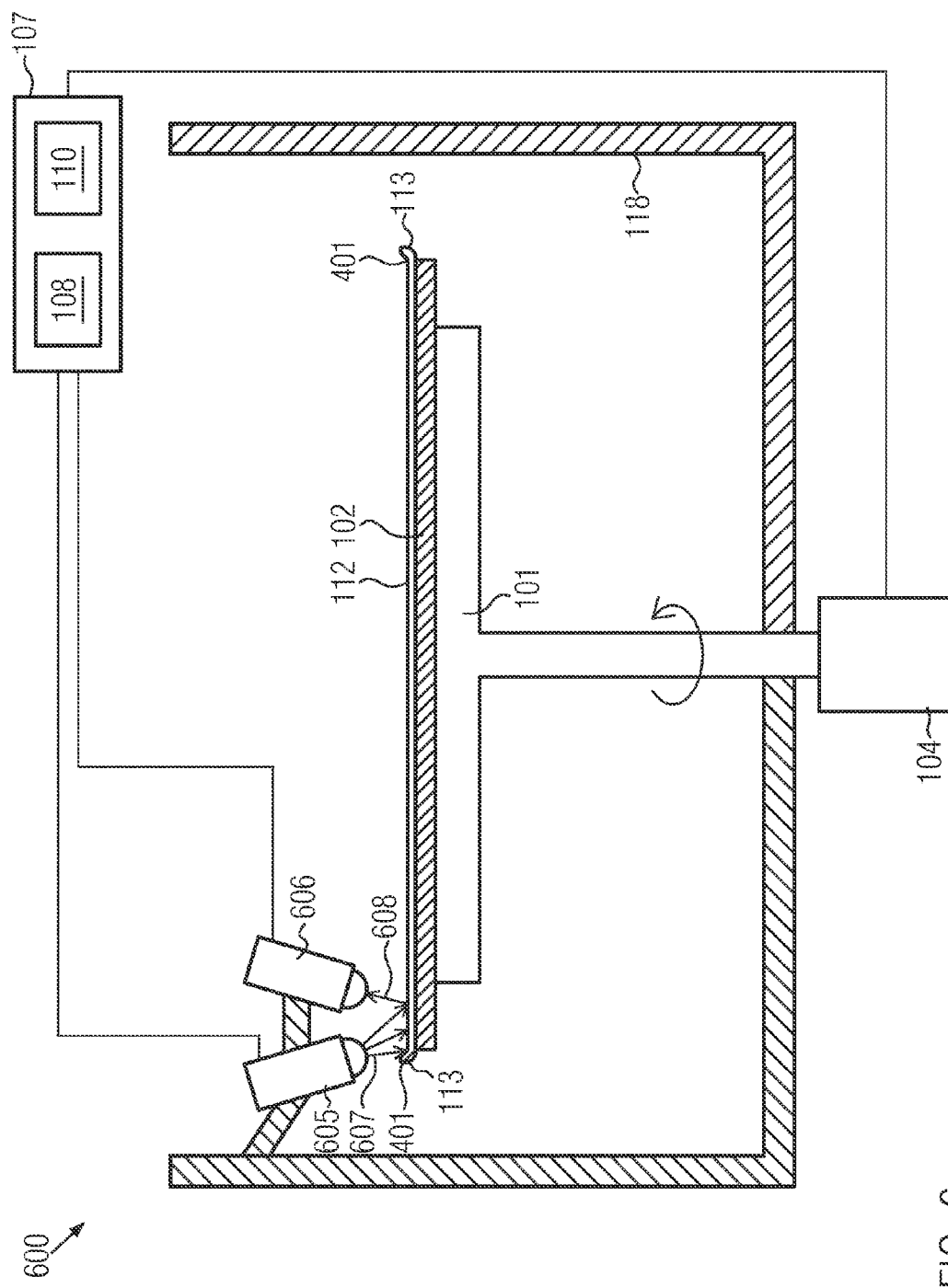
FIG. 6 shows a schematic cross-sectional view of a wafer edge exposure tool according to an embodiment in a stage of a method according to an embodiment.

FIG. 6 shows a schematic cross-sectional view of a wafer edge exposure tool 600 according to an embodiment which may be used in methods according to embodiments, for example, in methods in accordance with the flow diagram 800 shown in FIG. 8, as an alternative to the spin coating tool 100 shown in FIGS. 1-3. The edge exposure tool 600 may be included into an integrated lithographic track which may contain further similar edge exposure tools and also other tools or units, for example, coating, bake or development tools or units. For convenience, in FIGS. 1-3, on the one hand, and in FIG. 6, on the other hand, like reference numerals have been used to denote like components. Unless explicitly stated otherwise, components of the tools 100, 600 denoted by like reference numerals may have corresponding features, and a detailed description thereof will sometimes be omitted.

The wafer edge exposure tool 600 includes a wafer chuck 101 that is configured for mounting a wafer 102 thereon, a drive 104 configured for rotating the wafer chuck 101 and the wafer 102 mounted thereon around an axis of rotation, a housing 118, and a processing unit 107 comprising an evaluation unit 108 and a control unit 110.

The wafer 102, which is covered with a coating layer 112, may be provided on the wafer chuck 101. The wafer edge exposure tool 600 is adapted for use in a method wherein the coating 112 includes a photoresist. The coating 112 may be applied to the wafer 102 previous to bringing the wafer to the wafer edge exposure tool by methods similar to the methods described above with reference to FIGS. 1-3, which may include performing a spin coating process. In embodiments where no edge bead removal has been performed after the application of the coating 112, the coating may have an edge bead 113. In other embodiments, the coating may have no edge bead, for example, if an edge bead removal process similar to the process described above with reference to FIG. 3 has been performed after application of the coating 112. The photoresist included in the coating 112 may be a positive photoresist, wherein exposed portions of the photoresist become soluble in a photoresist developer belonging to a positive development process and unexposed portions of the photoresist are substantially insoluble in the developer.

The wafer edge exposure tool 600 may include a light source 605 that is adapted to emit light 607 towards an edge area 401 of the wafer 102. In particular, the light source 605 may be adapted so that the light 607 is substantially emitted only towards the edge area 401 of the wafer 102 and a central portion of the wafer 102 is substantially not irradiated with the light 607. Furthermore, the light source 605 may be adapted such that the light 607 emitted by the light source 605 has one or more actinic wavelengths that are suitable for rendering the photoresist of the coating layer 112 soluble in a subsequent development process. The light source 605 may be monochromatic or polychromatic.

The light source 605 may be used for performing a wafer edge exposure process. In the edge exposure process, the control unit 110 may control the drive 104 so that the wafer chuck 101 and the wafer 102 mounted thereon are rotated at a speed of rotation that may be slower than the relatively high speed of rotation that has been used in the formation of the coating 112, as described with reference to FIG. 2. Furthermore, the control unit 110 may operate the light source 605 so that the light source 605 emits light 607 and the edge area 401 of the wafer 102 is irradiated with the light 607 emitted. In doing so, a portion of the photoresist of the coating 112 in the edge area 401 of the wafer 102 may be exposed.

In later stages of a wafer production flow, in particular, after exposing the photoresist of the coating 112 by means of an exposure tool wherein a photomask is projected to the wafer 102, the photoresist of the coating 112 may be developed for forming a photoresist mask. In doing so, exposed portions of the photoresist are removed. Since the portion of the photoresist at the edge area 401 of the wafer 102 has been exposed in the edge exposure process, the portion of the photoresist at the edge area 401 of the wafer 102 is removed in the development process. In doing so, the edge bead 113 and/or other portions of the photoresist at the edge area 401 of the wafer 102 are also removed, creating a smooth and well-defined outer edge of the photoresist mask.

Further features of the wafer edge exposure process may correspond to those of known wafer edge exposure processes.

The wafer edge exposure tool 600 may further include a light detector 606. The light detector 606 may be configured for receiving reflected light 608, which is light 607 from the light source 605 reflected at the edge area 401 of the wafer 102. The light detector 606 may be configured for measuring an integral intensity of the reflected light 608, for performing a spectrally resolved measurement, wherein intensities of the reflected light 608 are measured at different wavelengths, and/or a polarization resolved measurement, wherein intensities of the reflected light 608 are measured for one or more polarization directions. Further features of the light detector 606 may correspond to those of the light detector 106 described above with reference to FIGS. 1-3, wherein, however, the wavelength sensitivity of the light detector 606 may be adapted to the wavelengths emitted by the light source 605. The light detector 606 may be used for performing an inspection of the wafer 102 during the wafer edge exposure process, while the light source 605 irradiates the edge area 401 of the wafer 102 with the light 607. The inspection of the wafer 102 may include a measurement of a reflection trace of the edge area 401 of the wafer 102. For measuring a reflection trace, the detector 606 may be used for measuring one or more quantities relating to an intensity of the reflected light 608 while the wafer chuck 101 and the wafer 102 mounted thereon are rotated, for providing one or more measurement values related to the intensity of the reflected light 608 for each of a plurality of positions along the azimuthal direction of the wafer 102. Further features of the reflection trace measurement may correspond to those of the reflection trace measurement described above with reference to FIGS. 1-5.

In further embodiments, the inspection including the emission of light 607 directed at the edge area 401 of the wafer and the detection of reflected light 608 may be performed independently of the wafer edge exposure process, for example, before or after the wafer edge exposure process, for example, with an intensity of the light 607 and/or a wafer rotation speed that are different from an intensity and/or rotation speed used for the wafer edge exposure. In still further embodiments, the light source used for the wafer inspection may be a different light source than the light source used for the wafer edge exposure, for example, a light source emitting light of one or more different wavelengths, for example, non-actinic wavelengths; in this case, a light source and a corresponding detector similar to elements 105 and 106 illustrated in FIGS. 1-3 may be added to the wafer edge exposure tool 600 for the wafer inspection, and the light detector 606 may be omitted; the wafer inspection may then be performed before, during, or after the wafer edge exposure.

In still further embodiments, a coating of wafer 102 with a coating layer containing a photoresist, with or without a subsequent edge bead removal, a wafer edge exposure, and a wafer inspection, corresponding to methods described above with reference to FIGS. 1-6, respectively, may be performed in one tool. For example, the one tool may be a spin coating tool similar to tool 100 illustrated in FIGS. 1-3, including also a light source for the wafer edge exposure similar to light source 605 in FIG. 6. If the wafer inspection is performed with light from the light source for the wafer exposure, light source 105 and light detector 106 may be omitted in the one tool, and a light detector similar to detector 606 in FIG. 6 may be provided for the recording of reflected light. The light source for the wafer edge exposure and/or the corresponding detector may include features for protecting them from contamination and may be controlled by a control unit of the one tool, and the corresponding detector may be connected to an evaluation unit of the one tool.

In some or all of these further embodiments, features of the reflection trace measurement may correspond to those of the reflection trace measurement described above with reference to FIGS. 1-5.

Referring again to FIG. 6, similar to the spin coating tool 100, the wafer edge exposure tool 600 may be used for recording a reflection trace for each of a plurality of wafers processed by means of the wafer edge exposure tool 600. On the basis of the reflection traces, a defect analysis may be performed for each of the wafers processed by the wafer edge exposure tool 600. The defect analysis may be performed as described above.

The tools and methods for inspection of a wafer edge area, which are described above with reference to FIGS. 3-6, may have the advantage that the time for inspection of a wafer edge area will be relatively short, for example, from about 1 second to about 60 seconds, in particular about 10 seconds, and thus significantly shorter than the time required for an inspection of a full wafer surface or a significant part of a wafer surface with one of the inspection techniques common in the industry. In particular, the shorter inspection time may be related to features of some characteristic defects occurring in spin coating processes, wherein the defects typically extend to the wafer edge. Therefore, in contrast to inspection techniques common in the industry, the methods described above need not include an inspection of a central portion of the wafer for every wafer inspected at 804. Furthermore, if the wafer edge inspection of one wafer of a lot is performed in a unit of an integrated lithographic track at the same time when other wafers of the same lot are processed and/or inspected in other units of the track, the time added by the wafer edge inspection of one or more wafers of the lot to the total processing time of the lot in the track may be further reduced significantly. Furthermore, if the wafer edge inspection is performed during an edge bead removal or during an edge exposure process, substantially no time or only a relatively small amount of time needs to be added to the processing time of each wafer by the inspection. Therefore, the inspection methods described herein may allow the inspection of a greater fraction of wafers, for example, all wafers processed at a processing step, compared to techniques common in the industry. Correspondingly, the probability that wafers with defects to which the inspection methods included in this disclosure are sensitive will escape detection may be significantly reduced. Furthermore, the integration of the inspection tools into a wafer coating tool as described with reference to FIGS. 1-3 and 6, or into an integrated lithographic track, may allow performing the inspection of the wafer edge area at a relatively short time after the coating process, thus allowing relatively fast reaction if defects are present on processed wafers. Furthermore, since the tools used for inspection of a wafer edge area described herein are relatively simple, the cost of implementing them may be significantly lower than the cost of inspection tools commonly used in the industry.

In methods as described above with reference to FIG. 8, the methods used for inspection and defect analysis at 804, which are described with reference to FIGS. 3-6, are part of a feedback loop that includes adjustment of the set value provided at 801 in cases where certain predefined conditions are met. In other embodiments, an inspection as described above with reference to FIGS. 3-6 need not be linked to adjustments of the set value like the one provided in 801, but it may be used only for the purpose of inspecting many wafers, for example, all wafers processed at a processing step as performed at 803, for the presence of defects in the wafer edge area, in particular coating-related defects, which may be, but do not have to be, related to the set value, in a relatively short time and with a relatively small delay after a processing as performed at 803, and submitting wafers identified as having defects to a further treatment as performed at 811 which may include rework. In such embodiments, only a portion of the process flow illustrated by the flow diagram of FIG. 8 including the acts performed at 801 to 805 and, optionally, 806 and 811, needs to be performed.

In further embodiments, the acts performed for adjusting a set value like the one provided in 801, as performed at 808 and 810, may include other elements in addition to or instead of changing the set value by predefined percentages, for example, a choice of a new set value by one or more engineers or other trained persons based on, for example, experience, further risk assessment, further data analysis, further tests and/or additional experiments.

In the following, further embodiments will be described with reference to FIGS. 7, 9a and 9b.

Figure 9A:
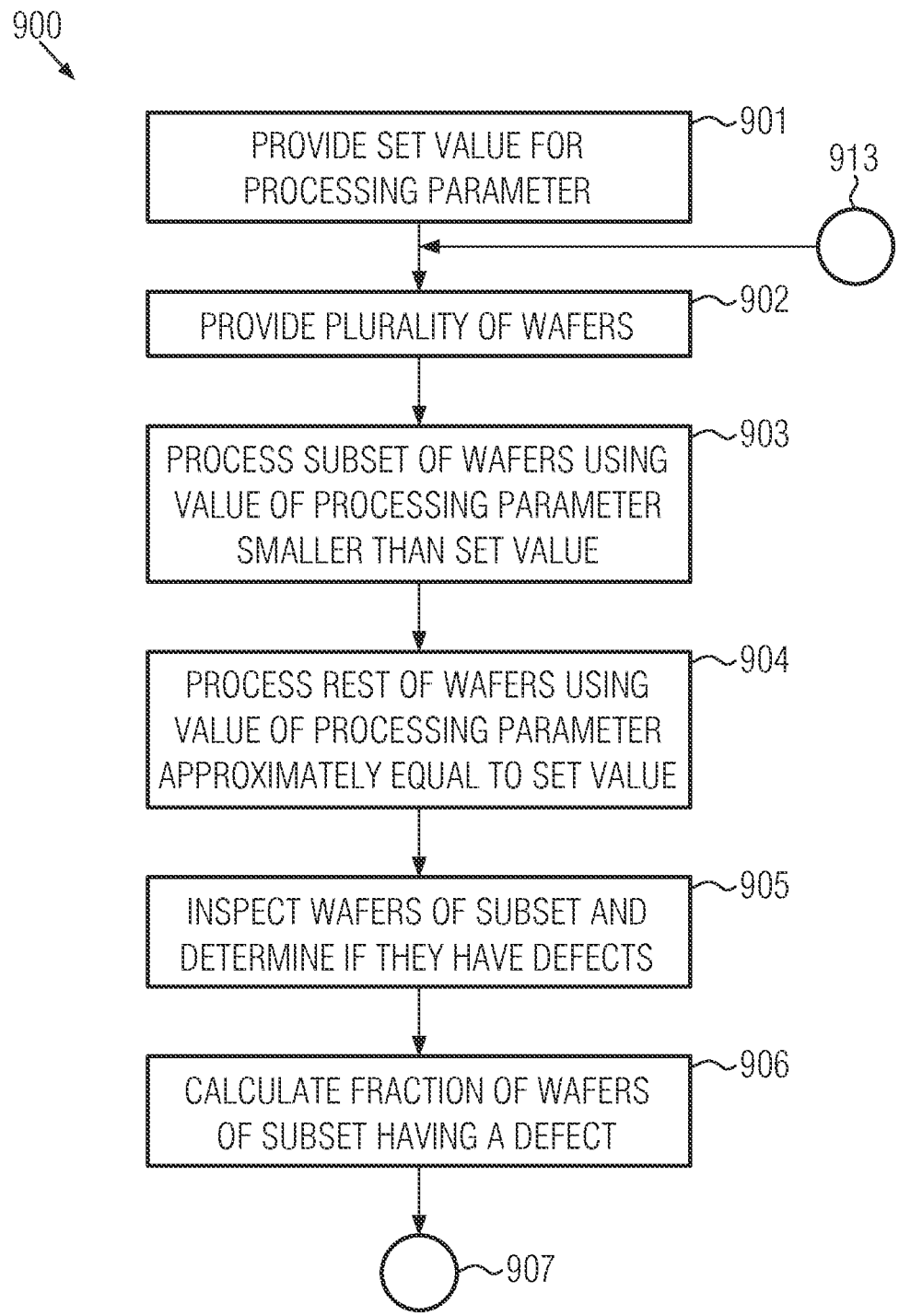
FIGS. 9a and 9b show a schematic flow diagram of a method according to an embodiment.
Figure 9B:
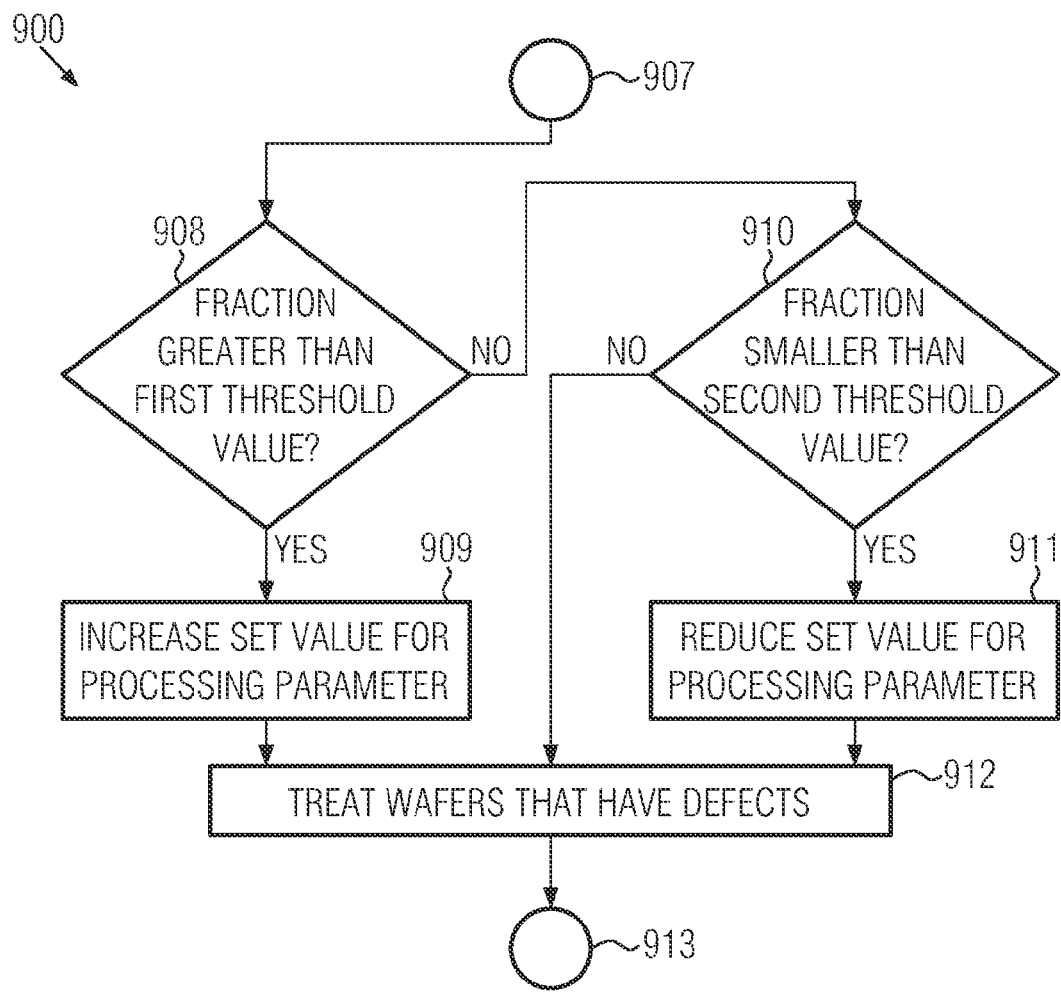

FIGS. 9a and 9b show a schematic flow diagram 900 of a method according to an embodiment. At 901, a set value for a processing parameter is provided. In some embodiments, the set value for the processing parameter may be a set value for an amount of fluid that is used as a coating solution in a spin coating process, similar to the coating solutions described above in the context of the embodiments of FIGS. 1-6 and 8. In other embodiments, the set value for the processing parameter may be a set value for an amount of a fluid used in a process other than a spin coating process, in particular in a process that is performed in semiconductor manufacturing.

In some of these embodiments, the process may be a single wafer cleaning process, and the set value provided at 901 may be a set value for an amount of a wafer cleaning solution that is supplied to a wafer in the single wafer cleaning process.

In other embodiments, the process may be a photoresist development process, and the set value provided at 901 may be a set value for an amount of a photoresist developer that is supplied to a wafer.

In further embodiments, the process may be a rinse process, and the set value provided at 901 may be a set value for an amount of a rinse solution that is used for rinsing a wafer.

In further embodiments, the process may be a pre-wetting process, and the set value for the processing parameter provided at 901 may be an amount of a pre-wetting solution that is supplied to a wafer.

In still further embodiments, the processing parameter for which a set value is provided at 901 may include a processing parameter other than an amount of a fluid, for example, a processing time of a process, which may be a process that is performed in semiconductor manufacturing. For example, the set value provided at 901 may be a time of a development process, a wafer cleaning process, or a wafer priming or adhesion promotion process. In some embodiments, the processing time may be connected to an amount of material used in the processing, for example, if a flow of material is provided to the wafer during the processing time.

In still further embodiments, the processing parameter for which a set value is provided at 901 may include allowed minimum and/or maximum values for a delay or waiting time between two processing steps or portions of one processing step. A certain minimum delay between steps or portions of a step may be helpful for avoiding defects, for example, to allow portions of the integrated circuit to approach a chemical or thermal equilibrium before further processing, while too long delays may increase tool usage times and/or duration of the wafer production or cycle time. In this case, it may be desirable to make the minimum allowed delay value as short as possible while avoiding an increased occurrence of defects. Such embodiments will be denoted as delay minimization embodiments in the following. In other embodiments, a too long delay may lead to an increased occurrence of defects, for example, due to changes of wafer surface properties, while a greater maximum allowed delay may be advantageous for greater flexibility within the productive environment in which the wafers are processed, and thereby lead to a lower percentage of tool idling time and a higher throughput of the productive environment. In this case, it may be desirable to make the maximum allowed delay value as long as possible while avoiding an increased occurrence of defects. Such embodiments will be denoted as delay maximization embodiments in the following.

At 902, a plurality of wafers is provided. Similar to the embodiments described above with reference to FIGS. 1-6 and 8, the method illustrated by the flow diagram 900 of FIGS. 9a and 9b may be performed in a context-specific manner. Accordingly, the wafers of the plurality of wafers provided at 902 may be wafers that are processed by means of one of one or more predetermined tools, wafers used for the manufacturing of a product of a predetermined type, wafers at one of one or more predetermined stages of a wafer production flow and/or wafers that are to be processed in a formation of one of one or more predetermined layers of an integrated circuit. The plurality of wafers 902 may include one or more lots of wafers.

At 903, a subset of the plurality of wafers is processed using a value of the processing parameter that is different from the set value, which may be smaller or greater than the set value. In embodiments wherein the process parameter includes an amount of fluid or a processing time and for delay minimization embodiments, the subset may be processed using a value that is smaller than the set value. In delay maximization embodiments, a value greater than the set value may be used. For convenience, only the case of a value smaller than the set value is illustrated in FIGS. 9a and 9b.

The subset of the plurality of wafers includes only a part of the plurality of wafers provided at 902. In some embodiments, the subset of the plurality of wafers may include one wafer per lot. In other embodiments, the subset may include one wafer of every few lots. For example, one wafer per a number of lots in a range from about 1 to about 3 may be included into the subset of wafers for which a value of the processing parameter different from the set value is used.

In further embodiments, a few wafers per lot may be included into the subset of wafers that is processed using a value of the processing parameter different from the set value, for example, a number of wafers in a range from about 1 to about 4. As will be described below, in some embodiments, all wafers of the subset may undergo an inspection later in the process flow. The fraction of wafers of the plurality of wafers provided at 902 that are included into the subset may, therefore, be determined considering the capacity of the corresponding inspection tools and/or an acceptable value for the time added by the inspection to the overall cycle time of the plurality of wafers provided at 902.

In embodiments wherein the processing parameter is an amount of fluid, such as a coating solution for a spin coating process, a cleaning process for a single wafer cleaning process, a photoresist developer for a photoresist development process, a rinse solution for a rinse process or a pre-wetting solution for a pre-wetting process, a process of the respective type may be performed for each of the wafers of the subset of the plurality of wafers, wherein the amount of the fluid supplied to the wafer is reduced relative to the set value of the amount of fluid by a predetermined amount, for example, by an amount in a range from about 1% to about 20%, in particular by about 10%. Alternatively, the predetermined amount by which the amount of the fluid supplied to the wafer is reduced relative to the set value may be greater than 20%.

In embodiments wherein the processing parameter is a processing time, each of the wafers of the subset may be processed for an amount of time that is shorter than the set value of the processing time.

In delay minimization embodiments, each of the wafers of the subset may be processed with a delay between process steps or portions of a process step that is shorter or smaller than a minimum allowed delay value included in the set value. Thus, not only the minimum allowed delay may be reduced for the wafers of the subset, but the actual delay between the processing steps or portions of processing steps used for these wafers may be made shorter than the set value for the minimum allowed delay.

Similarly, in delay maximization embodiments, each of the wafers of the subset may be processed with a delay between process steps or portions of a process step that is longer or greater than a maximum allowed delay value included in the set value.

At 904, a rest of the plurality of wafers provided at 902 may be processed using a value of the processing parameter that is approximately equal to the set value of the processing parameter. In embodiments wherein the processing parameter is an amount of fluid, the rest of the wafers may be processed using an amount of the fluid that is approximately equal to the set value of the amount of fluid.

In embodiments wherein the processing parameter is a processing time, each of the rest of the wafers may be processed for an amount of time that is approximately equal to the set value for the processing time.

In delay minimization and delay maximization embodiments, each of the rest of the wafers may be processed with delays between process steps or portions of a process step that are longer or greater than a minimum allowed value and/or shorter or smaller than a maximum allowed value provided by the set value.

Accordingly, in embodiments wherein the processing parameter is an amount of fluid, each wafer of the rest of the plurality of wafers receives a greater amount of fluid than the wafers of the subset of the plurality of wafers. Therefore, the wafers of the rest of the plurality of wafers processed at 904 may have a substantially smaller likelihood of having a defect after being processed, wherein the defect is characteristic of an insufficient amount of fluid used in the processing. For example, in embodiments wherein the process is a spin coating process, "shark tooth" defects which are characteristic of an insufficient amount of coating solution will more likely occur in wafers of the subset of wafers wherein an amount of the coating solution smaller than the set value for the amount of coating solution was used. In embodiments wherein the process is a process other than a spin coating process, the types of defects formed may be different from the characteristic "shark tooth" defects that typically occur in a spin coating process when a too small amount of a coating solution is used.

Similarly, in embodiments wherein the processing parameter is a processing time, defects caused by an insufficient duration of the processing are more likely to occur in the subset of the plurality of wafers than in the rest of the plurality of wafers.

Similarly, in delay minimization embodiments, defects caused by a too short or small delay are more likely to occur in the subset of the plurality of wafers than in the rest of the plurality of wafers.

Similarly, in delay maximization embodiments, defects caused by a too long or great delay are more likely to occur in the subset of the plurality of wafers than in the rest of the plurality of wafers.

Figure 7:
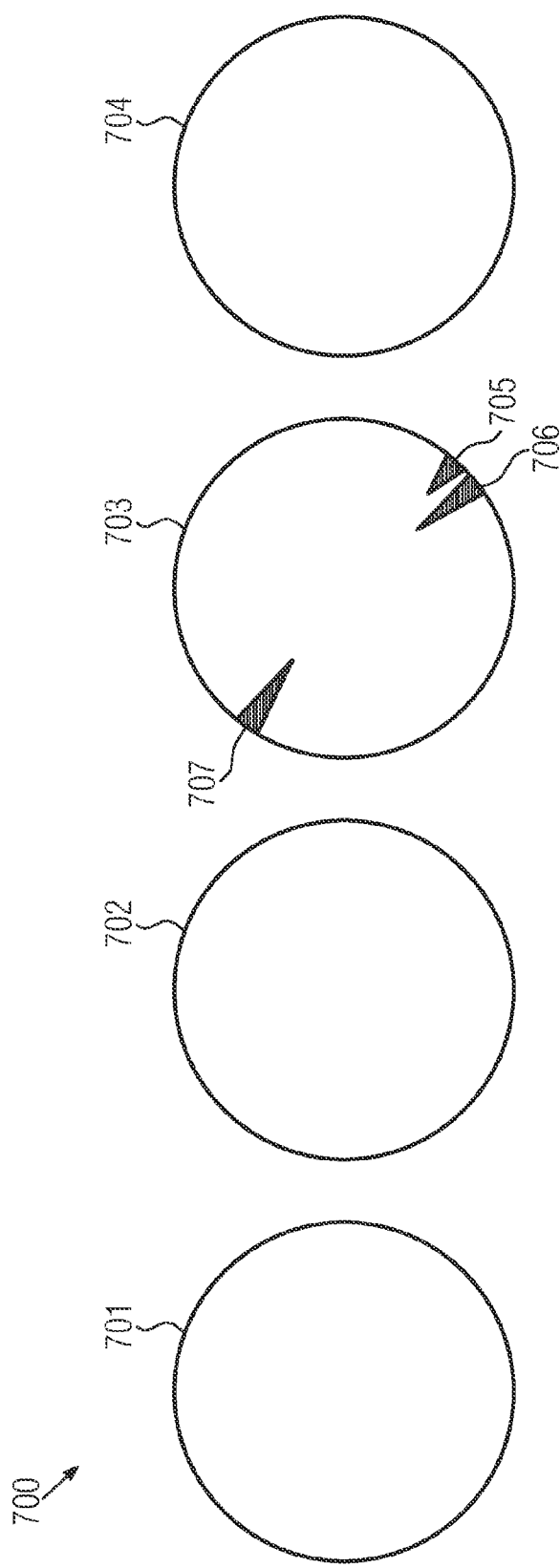
FIG. 7 schematically shows a plurality of wafers that are processed in a method according to an embodiment.

FIG. 7 shows a plurality of wafers 700, being an illustrative example of wafers of the plurality of wafers received at 902 in an embodiment wherein the process is a spin coating process. The plurality of wafers 700 includes wafers 701, 702, 703 and 704. Among the wafers 701 to 704, wafer 703 has been included into the subset of wafers for which a spin coating process is performed using an amount of coating solution that is smaller than the set value of the amount of the coating solution. Wafers 701, 702, 704 are wafers of the rest of the wafers, wherein a spin coating process is performed using an amount of coating solution approximately equal to the set value for the amount of coating solution.

Wafer 703 may have defects 705, 706, 707, which are "shark tooth" defects caused by an insufficient amount of coating solution, similar to the "shark tooth" defects 402, 403, 404 of the wafer 102 described above with reference to FIG. 4. Wafers 701, 702, 704 each may have a coating formed on a surface thereof that is substantially intact and free of defects.

At 905, the wafers of the subset of the plurality of wafers that was processed using a value of the processing parameter different from the set value of the processing parameter may be inspected, and a defect analysis may be performed for each of the wafers based on a result of the inspection, wherein it is determined whether the wafer has a defect. In some embodiments, the defect analysis may include a determining of a number and/or size and/or total area and/or a location of defects on each wafer, similar to the defect analysis at 804 described above with reference to FIG. 8. Depending on the technique used for inspecting the wafers, the inspection and defect analysis may also include a determining of a shape of defects on each wafer. Depending on the nature of the processing performed at 903 and 904 and on the technique used for the inspection, the defect analysis may also include identifying defects related to the value of the processing parameter and defects not related to the value of the processing parameter, for example, by comparing a size, location and/or shape of a defect with one or more corresponding characteristic properties of a defect related and/or a defect not related to the value of the processing parameter. In this case, defects determined as being not related to the value of the processing parameter may be discounted as defects for the further processing flow, although wafers which such defects may still undergo further treatment later in the processing flow, for example, reworking.

In some embodiments, the inspection of the wafers at 905 may be performed using known techniques for an inspection of wafers in the wafer processing flow, which may include techniques for a manual inspection of wafers such as a visual inspection, optionally being performed by means of optical instruments such as, for example, microscopes, or an automatic inspection of wafers using known inspection tools for the inspection of semiconductor wafers.

In other embodiments, the inspection of the wafers of the subset of the plurality of wafers may be performed using a processing tool that is adapted for the inspection of wafers during the processing of the wafers. For example, in embodiments wherein a spin coating process is performed on the wafers, the spin coating process may be performed using the spin coating tool 100 described above with reference to FIGS. 1-3, and the inspection of the wafers may be performed by means of the light source 105 and the light detector 106, using techniques as described above. Similarly, edge exposure tool 600 from FIG. 6 may be used in embodiments wherein a wafer edge exposure process is performed on the wafers, and light source 605 and light detector 606 may be used for the inspection of the wafers.

In further embodiments, a wafer inspection tool that is different from the wafer processing tools employed for processing the wafers of the plurality of wafers may be used.

The inspection results for the wafers may be provided in the form of measurement values for one or more properties of the wafers, for example, measurement values related to reflectivities of the wafers, similar to the reflection traces described above. In some embodiments, the measurement results obtained for the wafers of the subset of the plurality of wafers may be compared with measurement results that were obtained for wafers of the rest of the wafers, for example, with an average or median of measurement results obtained for a plurality of wafers of the same lot or of different lots that were processed using a processing parameter approximately equal to the set value of the processing parameter. This may help to provide a particularly sensitive way of determining the presence of defects indicative of a too small or a too large value of the processing parameter in the subset of the plurality of wafers.

In some embodiments, all of the wafers of the subset of the plurality of wafers may be inspected. Since defects are less likely to occur in the rest of the plurality of wafers, an inspection need not be performed for all of the wafers of the rest of the plurality of wafers.

In some embodiments, in particular if defects related to the value of the processing parameter may be clearly identified in the inspection and/or the defect analysis without comparing the measurement result obtained for a wafer of the subset of the plurality of wafers with measurement results obtained for wafers of the rest of the plurality of wafers, for example by their location or shape, an inspection of wafers of the rest of the plurality of wafers may be omitted.

The acts performed at 903, 904 and 905 need not be performed in the sequence described above. For example, the processing of wafers of the subset of the plurality of wafers using a value of the processing parameter that is different from the set value of the processing parameter at 903 may be performed intermediate the processing of wafers of the rest of the wafers using a value of the processing parameter approximately equal to the set value. Furthermore, the inspection of wafers of the subset of the plurality of wafers may be performed intermediate the processing of other wafers of the plurality of wafers, or simultaneously to the processing of other wafers of the plurality of wafers.

In some embodiments, similar to the embodiments described above with reference to FIG. 8, the defect analysis may comprise a further examination of wafers from the subset of the plurality of wafers for which it was determined that they have a defect to verify and/or correct a result of the defect analysis that is obtained as described above. The further examination may be performed in accordance with known automatic or manual techniques for the inspection of wafers. Defects identified as being not related to the set value in the further examination may be discounted as defects, and wafers having no defects identified as being related to the set value in the further inspection step may be discounted as wafers having defects, although such wafers may still undergo further elements of treatment, for example, reworking.

In some embodiments, an inspection and/or a defect analysis of wafers of the rest of the plurality of wafers may be performed, and it may be determined if the rest of the plurality of wafers also includes wafers having defects. In some embodiments, wafers of the rest of the plurality of wafers may be selected for inspection and/or defect analysis based on one or more results of the defect analysis of the wafers of the subset of wafers that have been processed with the value of the processing parameter different from the set value. For example, within wafers of one lot, wafers of the rest of the plurality of wafers may undergo an inspection and/or defect analysis only if a defect related to a value of the processing parameter has been found on a wafer belonging to the subset of wafers processed with the value of the processing parameter different from the set value. In other embodiments, if the defect occurrence in inspected wafers of the subset of the plurality is very similar to inspected wafers of the rest of wafers, further wafers of the rest of wafers may be inspected to determine whether there is a significant difference in defect occurrence between wafers of the subset and wafers of the rest of the plurality of wafers.

At 906, one or more indicative quantities that are indicative of an occurrence of defects in the subset of the plurality of wafers may be calculated. In some embodiments, the one or more indicative quantities may include one or more quantities indicative of a fraction of wafers of the subset of the plurality having a defect. Additionally and/or alternatively, the one or more indicative quantities may include one or more quantities indicative of the average number and/or size and/or total area of defects per wafer of the subset of the plurality. Quantities indicative of a fraction of the wafers of the subset of the plurality of wafers having a defect may include a ratio between a number of wafers of the subset having a defect and a total number of wafers of the subset and/or a number of wafers of the subset that have been processed since the last occurrence of a defect. In other embodiments, the one or more indicative quantities may include a difference in occurrence and/or number and/or size and/or total area of defects between wafers of the subset of the plurality of wafers and wafers of the rest of the plurality of wafers for which an inspection and/or a defect analysis has been performed. For convenience, only the case of quantities indicative of the fraction of wafers of the subset with defects is illustrated in FIGS. 9a and 9b.

At 907, transition is made to the portion of the flow diagram 900 shown in FIG. 9b, and it is determined at 908 if one of the indicative quantities calculated at 906 is greater than a first threshold value. If this is the case, in embodiments wherein the subset of the plurality of wafers is processed using a value of the processing parameter that is smaller than the set value, at 909, the set value for the process parameter may be increased, and the method may continue at 912. If the set value is increased, the value of the process parameter other than the set value that is used for the subset of the plurality of wafers may be increased by substantially the same amount as the set value. Otherwise, at 910, it may be determined if one of the indicative quantities calculated at 906 is smaller than a second threshold value. If this is the case, at 911, the set value for the process parameter may be reduced, and the method may continue at 912. If the set value is reduced, the value of the process parameter other than the set value that is used for the subset of the plurality of wafers may be reduced by substantially the same amount as the set value. Otherwise, the set value for the process parameter may be maintained, and the method may continue at 912.

In embodiments wherein the subset of the plurality of wafers is processed using a value of the processing parameter that is greater than the set value, the set value and the value of the processing parameter used for the subset of the plurality of wafers may be reduced at 909 and increased at 911.

Features of the acts performed at 908 to 911 may correspond to features of the acts performed at 807 to 810 in the methods described above with reference to FIG. 8. In particular, the set value for a process parameter may be changed in a context-specific manner.

At 912, wafers that were determined to have defects in the inspection and/or defect analysis of the wafers of the subset of the plurality of wafers at 905 may be treated. Similarly, wafers of the rest of the plurality of wafers for which an inspection and/or defect analysis was performed and which were determined to have defects may also be treated. This treatment may be substantially similar to the treatment of wafers having defects described with reference to step 811 in FIG. 8. The treatment of the wafers that have defects may include a reworking of the wafers. For example, in embodiments wherein the process performed on the wafers is a spin coating process, the defective coating of the wafers may be removed. In embodiments wherein the wafers are coated with a photoresist in the spin coating process, this may be done by means of a photoresist strip process. Thereafter, a new coating may be formed by spin coating.

In some embodiments, the treatment of the wafers that have been determined to have defects may occur at an earlier point in the flow. For example, if the plurality of wafers provided at 902 includes more than one lot, a reworking of the wafers with defects of each lot may be performed when the processing at 903 and 904 and the inspection and/or defect analysis at 905 has been completed for the wafers of the lot.

In some embodiments, the treatment of wafers at 912 may include a treatment of further wafers for which it is determined, based on results of the inspection and defect analysis of wafers other than the further wafers, that they have an increased risk of having one or more defects, for example, wafers of lots in which one or more wafers were found to have defects.

Then, at 913, transition may be made to the portion of the flow diagram 900 shown in FIG. 9a, and the method may continue with providing another plurality of wafers that are to be processed in the same context of the manufacturing process as the plurality of wafers processed earlier in accordance with the method illustrated by the flow diagram 900, and steps 903 to 912 may be performed for the other plurality of wafers.

In the embodiments described above with reference to FIGS. 9a and 9b, the acts performed at 903 to 905 are part of a feedback loop that includes adjustment of the set value provided in 901 in cases where certain predefined conditions are met. In other embodiments, no adjustment of the set value may be included, and acts substantially similar to those performed at 903 to 905 may be used for the purpose of efficiently detecting the presence of defects related to a set value like the set value provided at 901 and subsequently submitting wafers identified as having defects to a further treatment as performed at 912, and/or submitting wafers of the rest of the plurality of wafers to further treatment if the fraction of wafers having defects or the average number and/or size and/or total area of defects per wafer calculated at 906 is higher than a predetermined threshold. For example, if a wafer of a lot is processed with a value of a processing parameter different from a set value, and a defect related to the value of the processing parameter is found on the wafer, the whole lot may be inspected and wafers with defects may be reworked, or the whole lot may be reworked summarily. In still further embodiments, acts similar to those performed at 903 to 905 may simply be used in order to decrease a safety margin of a processing parameter for some or all wafers that are inspected at an inspection step, thereby generating a cost or time saving for these wafers only; for example, the set value for the processing parameter provided at 901 may include a relatively large safety margin that substantially excludes the occurrence of defects related to the processing parameter, and wafers which are sampled for inspection at 905 may be included into the subset for which the processing parameter includes a much smaller safety margin. In such further embodiments, acts of the flow diagram 900 illustrated in FIGS. 9a and 9b other than those performed at 901 to 905 and, optionally, 906 and 912, may be omitted.

Compared to the embodiments described above with reference to FIGS. 1-6 and 8, methods as described above with reference to FIGS. 7, 9a and 9b may have the advantage that, in some embodiments, they may be carried out using known wafer inspection processes, which may be performed without requiring a modification of processing tools, such as spin coating tools, and still provide a high possibility of detecting defects related to a set value for a processing parameter. This may simplify the implementation of the method. However, in methods as described above with reference to FIGS. 7, 9a, and 9b, the value of the processing parameter is substantially reduced to the minimum or maximum value only for the subset of the plurality of wafers for which a reduced or increased value, respectively, of the processing parameter is used, and a greater or smaller value of the processing parameter, respectively, is used for the other wafers. Therefore, the set value of the processing parameter is, in the course of a plurality of iterations of the method, adjusted to a value that is generally greater or smaller, respectively, than the optimum value, whereas the value of the processing parameter obtained in the iteration of the method of FIGS. 1-6 and 8 may substantially converge towards the optimum value, which is a minimum value in the cases illustrated in FIGS. 8, 9a and 9b. However, in methods as described above with reference to FIGS. 7, 9a, and 9b, the processing parameter may still be reduced compared to standard cases wherein margins of processing parameters such as an amount of fluid used in a spin coating process may be as large as about 20% to about 50%.

Methods as described above with reference to FIGS. 1-6 and 8 may allow a further reduction of the processing parameter, and they may provide an additional safety against defects, since more wafers, for example all wafers, may be inspected with methods as described above with reference to FIGS. 1-6.

An illustrative method disclosed herein includes processing a first plurality of wafers, wherein, for each of the first plurality of wafers, a first fluid is supplied to a surface of the wafer, wherein an amount of the first fluid supplied to the surface of the wafer is based on a set value of the amount of the first fluid, for each of at least a part of the first plurality of wafers, performing an inspection of the wafer and a defect analysis of the wafer, the defect analysis including determining if the wafer includes a defect that is indicative of an insufficient amount of the first fluid supplied to the surface of the wafer, calculating, on the basis of a result of the defect analysis, at least one indicative quantity, wherein each indicative quantity is a quantity indicative of an occurrence, in the at least a part of the first plurality of wafers, of defects that are indicative of an insufficient amount of the first fluid supplied to the surface of the wafer, and adjusting the set value for the amount of the first fluid on the basis of the at least one indicative quantity.

In some embodiments, at least one of the at least one indicative quantity is indicative of a fraction of the at least a part of the first plurality of wafers that has a defect that is indicative of an insufficient amount of the first fluid supplied to the surface of the wafer.

In some embodiments, the defect analysis includes determining at least one of a number, a size and a total area of defects of the wafer that are indicative of an insufficient amount of the first fluid supplied to the surface of the wafer and at least one of the at least one indicative quantity is indicative of at least one of an average number, an average size and an average total area of defects that are indicative of an insufficient amount of the first fluid supplied to the surface of the wafer.

In some embodiments, the adjusting of the set value includes increasing the set value for the amount of the first fluid if a first one of the at least one indicative quantity is greater than a first threshold value and reducing the set value for the amount of the first fluid if one of the first one of the at least one indicative quantity and a second one of the at least one indicative quantity is smaller than a second threshold value.

In some embodiments, the processing of the first plurality of wafers fulfills one or more predetermined conditions relating to a context of the processing, and the method further includes processing a second plurality of wafers, wherein the processing of the second plurality of wafers fulfills the one or more conditions, and wherein, for each of the second plurality of wafers, an amount of the first fluid that is based on the adjusted set value for the first fluid is supplied to the surface of the wafer.

In some embodiments, the one or more predetermined conditions are selected from the group of conditions including the processing of each of the first plurality of wafers is performed by means of one of one or more predetermined tools, the processing of each of the first plurality of wafers is performed during a manufacturing of a product of a predetermined type, the processing of each of the first plurality of wafers is performed at one of one or more predetermined stages of a wafer production flow, and the processing of each of the first plurality of wafers is performed during a formation of one of one or more predetermined layers of an integrated circuit.

In some embodiments, the method further includes performing a further examination of the wafer to confirm if a result of the defect analysis is correct when it is determined that the wafer includes a defect that is indicative of an insufficient amount of the first fluid supplied to the surface of the wafer, and adjusting the result of the defect analysis based on the further examination.

In some embodiments, the method further includes increasing a number of wafers for which the inspection is performed if it is determined that one or more of the wafers include a defect that is indicative of an insufficient amount of the first fluid supplied to the surface of the wafer.

In some embodiments, the first fluid includes a coating solution, and wherein the processing of the first plurality of wafers includes performing a spin coating process for each of the first plurality of wafers, the spin coating process including dispensing the amount of the first fluid to the surface of the wafer and rotating the wafer.

In some embodiments, the inspection of the wafer is an inspection of an edge area of the wafer. In some embodiments, the performing of the inspection of the edge area of the wafer includes providing a light source emitting light towards the edge area of the wafer while the wafer is rotated and detecting light emitted by the light source and reflected by the edge area of the wafer, wherein the defect analysis is performed on the basis of the detected light.

In some embodiments, the inspection of the wafer is performed for each wafer of the first plurality of wafers and wherein the amount of the first fluid supplied to the surface of each wafer of the first plurality of wafers is approximately equal to the set value of the amount of the first fluid.

In some embodiments, the at least a part of the first plurality of wafers is only a part of the first plurality of wafers being a subset of the first plurality of wafers, and the processing of the first plurality of wafers includes, for each of the wafers of the subset, supplying an amount of the first fluid that is smaller than the set value for the amount of the first fluid to the surface of the wafer and, for each of the wafers of the first plurality of wafers other than the wafers of the subset, supplying an amount of the first fluid that is approximately equal to the set value for the amount of the first fluid to the surface of the wafer.

In some embodiments, the defect analysis includes detecting characteristic defects that are caused by an insufficient amount of the first fluid.

In some embodiments, the method further includes performing an inspection of one or more wafers of the first plurality of wafers other than the wafers of the subset, wherein at least one of the defect analysis and the calculating of the at least one indicative quantity includes comparing one or more inspection results obtained by the inspection of one or more wafers of the subset with one or more inspection results obtained by the inspection of the one or more wafers of the first plurality of wafers other than the wafers of the subset.

In some embodiments, methods as disclosed herein include performing an edge bead removal process for the wafer, the edge bead removal process including directing a fluid jet including a second fluid to the edge area of the wafer while the wafer is rotated.

In some embodiments, the portion of the first light that is reflected at the edge area of the wafer is received during the edge bead removal process.

In some embodiments, the portion of the first light that is reflected at the edge area of the wafer is received one of before and after the edge bead removal process.

In some embodiments, the light source emits at least one of polychromatic light and light with a predetermined state of polarization, and the receiving of the portion of the first light reflected at the edge area of the wafer includes performing at least one of a spectrally resolved detection and a polarization-resolved detection.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
    performing a spin coating process, said spin coating process comprising dispensing a set value of an amount of a photoresist fluid to a surface of a wafer to form a photoresist material on said surface of said wafer;
    after performing said spin coating process, the method further comprising:
        performing an inspection of an edge area of said wafer by directing a first light from a first light source towards said edge area of said wafer while said wafer is rotated, wherein said first light is reflected at said edge area of said wafer, and
        receiving a portion of said first light that is reflected at said edge area of said wafer in a light detector while said wafer is rotated;
    performing a defect analysis on the basis of said inspection of said edge area of said wafer in a control unit, said defect analysis comprising determining if said edge area of said wafer comprises a defect that is indicative of an insufficient coating of said surface of said wafer by said first fluid;
    adjusting said set value of said amount of said first fluid in said control unit on the basis of a result of said determining if said edge region of said wafer comprises a defect; and
    directing a second light from a second light source towards said edge area of said wafer while said wafer is rotated, wherein said second light renders a portion of said photoresist material at said edge of said wafer soluble in a subsequent development process, wherein said first and second light sources comprise different light sources.

2. The method of claim 1, wherein performing said defect analysis further comprises determining at least one of a number, a size, a total area and a location of defects that are indicative of an insufficient coating of said surface of said wafer by said first fluid.

3. The method of claim 1, wherein said defect comprises a substantially uncoated portion of said edge area of said wafer.

4. The method of claim 1, wherein said first fluid comprises a photoresist solution, wherein said surface of said wafer is coated with photoresist in said spin coating process, and wherein said first light emitted by said first light source towards said edge area of said wafer renders a portion of said photoresist at said edge of said wafer soluble in a subsequent development process.

5. The method of claim 1, wherein said spin coating process, said inspection of said edge area of said wafer and said defect analysis are performed for each of a plurality of wafers, and wherein the method further comprises: calculating, on the basis of the result of said defect analysis, at least one indicative quantity, wherein each indicative quantity is a quantity indicative of an occurrence, in said plurality of wafers, of defects that are indicative of an insufficient amount of said first fluid dispensed to said surface of said wafer; and adjusting a set value for an amount of said first fluid dispensed to said surface of said wafer on the basis of said at least one indicative quantity.

6. The method of claim 1, further comprising generating a measured reflection trace based upon measuring said portion of said first light that is reflected at said edge area of said wafer, and wherein performing said defect analysis comprises performing at least one of the following:
- comparing said generated measured reflection trace with one or more reflection traces measured for one or more other wafers;
- comparing said generated measured reflection trace with a reference reflection trace; and
- performing one of detecting one or more irregularities of said generated measured reflection trace and determining that said generated measured reflection trace has no irregularity.

7. The method of claim 6, wherein said reference reflection trace is created on the basis of an inspection of a plurality of other wafers for which a spin coating process was performed.

8. The method of claim 6, wherein said reference reflection trace is created on the basis of a simulation of a reflection of light at said wafer.

* * * * *